US010066164B2

(12) United States Patent
Qiao et al.

(10) Patent No.: US 10,066,164 B2
(45) Date of Patent: Sep. 4, 2018

(54) SEMICONDUCTOR NANOCRYSTALS USED WITH LED SOURCES

(76) Inventors: Tiecheng Qiao, San Deigo, CA (US); David Battaglia, Fayetteville, AR (US); Suresh Sunderrajan, Pittsford, NY (US); Qiang Zhang, Fayetteville, AR (US); Haoguo Zhu, Fayetteville, AR (US)

( * ) Notice: Subject to any disclaimer, the term of this patent is extended or adjusted under 35 U.S.C. 154(b) by 0 days.

(21) Appl. No.: 13/381,577

(22) PCT Filed: Jun. 30, 2010

(86) PCT No.: PCT/US2010/001871
§ 371 (c)(1),
(2), (4) Date: Mar. 26, 2012

(87) PCT Pub. No.: WO2011/002509
PCT Pub. Date: Jan. 6, 2011

(65) Prior Publication Data
US 2012/0175588 A1 Jul. 12, 2012

Related U.S. Application Data

(60) Provisional application No. 61/269,909, filed on Jun. 30, 2009.

(51) Int. Cl.
*H01L 51/00* (2006.01)
*H01L 29/00* (2006.01)
*C09K 11/88* (2006.01)
*H01L 33/50* (2010.01)

(52) U.S. Cl.
CPC .......... *C09K 11/883* (2013.01); *H01L 33/502* (2013.01); *Y02B 20/181* (2013.01)

(58) Field of Classification Search
CPC ....... B82Y 30/00; B82Y 20/00; H01L 33/502; H01L 51/426; H01L 51/502; H01L 29/127; H01L 31/035218; H01L 31/035236; H01L 21/02513; H01S 5/341; H01S 5/34333; G06N 99/002; C09K 11/883
USPC ......... 257/13, 14, 24, 25.79; 438/73, 71, 22, 438/57, 800, 93, 98, 99
See application file for complete search history.

(56) References Cited

U.S. PATENT DOCUMENTS

| | | | |
|---|---|---|---|
| 7,611,082 B2 | 11/2009 | Harbers et al. | |
| 7,687,816 B2 | 3/2010 | Dias | |
| 7,696,964 B2 | 4/2010 | Lankhorst et al. | |
| 7,820,075 B2 | 10/2010 | Li et al. | |
| 7,892,452 B2 | 2/2011 | Ryowa et al. | |
| 9,412,905 B2 | 8/2016 | Su et al. | |
| 2004/0036130 A1* | 2/2004 | Lee et al. | 257/409 |
| 2005/0129947 A1* | 6/2005 | Peng et al. | 428/403 |

(Continued)

OTHER PUBLICATIONS

Yeh et al., "Making white-light-emitting diodes without phosphors", SPIE Newsroom. DOI:10.1117/2.1200802.1069, Mar. 12, 2008 (Mar. 12, 2008) p. 1.

(Continued)

*Primary Examiner* — Dale E Page
*Assistant Examiner* — Quovaunda V Jefferson
(74) *Attorney, Agent, or Firm* — Lynne M. Blank, Esq.

(57) ABSTRACT

The present invention relates to the use of light-converting, colloidal, doped semiconductor nanocrystals to provide a new generation of high performance, low cost monochromatic and white light sources based on LEDs.

17 Claims, 7 Drawing Sheets

Schematic diagram of LR dots

Emission Zone   Absorption Zone   Protection Zone

(56) References Cited

U.S. PATENT DOCUMENTS

| | | | |
|---|---|---|---|
| 2005/0287691 A1* | 12/2005 | Chen et al. | 438/29 |
| 2006/0014315 A1* | 1/2006 | Chan | B82Y 10/00 |
| | | | 438/99 |
| 2006/0177660 A1* | 8/2006 | Kumar et al. | 428/403 |
| 2008/0001538 A1* | 1/2008 | Cok | 313/506 |
| 2008/0012031 A1* | 1/2008 | Jang | C09K 11/02 |
| | | | 257/89 |
| 2008/0074050 A1* | 3/2008 | Chen et al. | 313/509 |
| 2008/0173845 A1 | 7/2008 | Ryowa et al. | |
| 2008/0246017 A1* | 10/2008 | Gillies et al. | 257/13 |
| 2009/0302304 A1* | 12/2009 | Peng et al. | 257/9 |
| 2010/0067229 A1 | 3/2010 | Scotch et al. | |

OTHER PUBLICATIONS

Peng, X., An Essay on Synthetic Chemistry of Colloidal Nanocrystals, Nano Research 2009, 2: 425-447.

X. Peng et al., "Epitaxial Growth of Highly Luminescent CdSe/CdS Core/Shell Nanocrystals with Photostability and Electronic Accessibility," J. Am. Chem. Soc. 119, 7019 (1997).

Xie et al., "Synthesis and Characterization of Highly Luminescent CdSe-Core CdS/Zn0.5Cd0.5S/ZnS Multishell Nanocrystals", J. Am. Chem. Soc., vol. 127. No. 20, 7480-7488 (2005).

* cited by examiner

Fig. 1
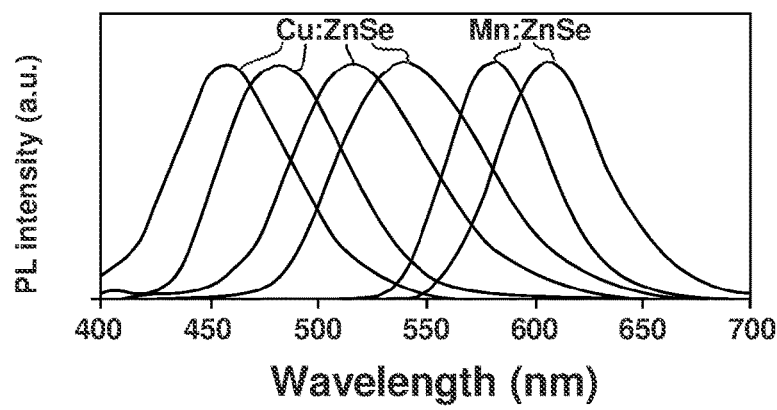
Green  Yellow  Orange
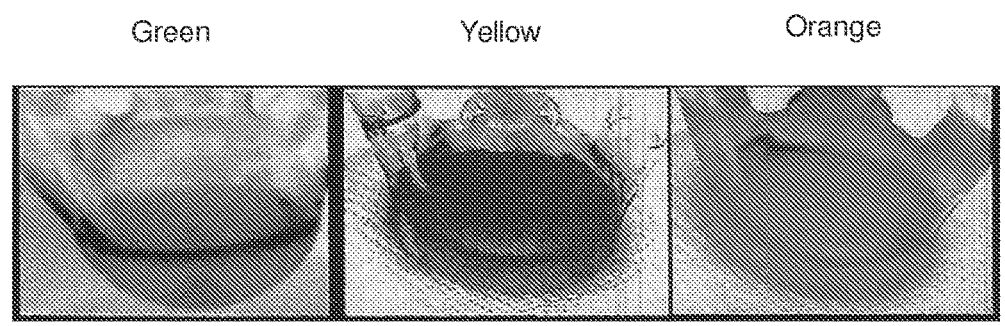
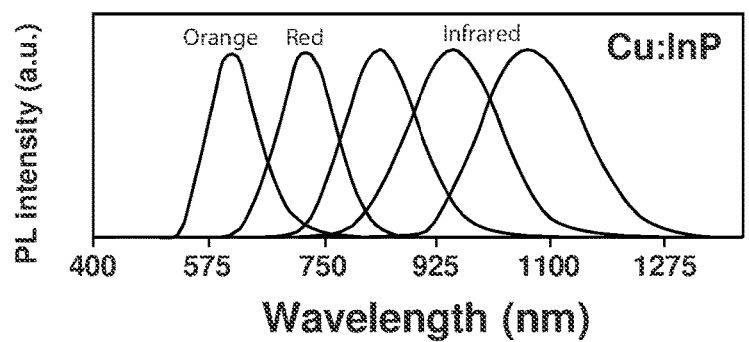

Fig. 2
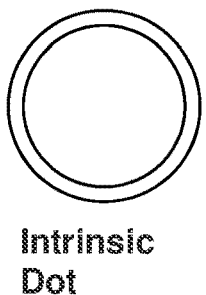
Intrinsic Dot
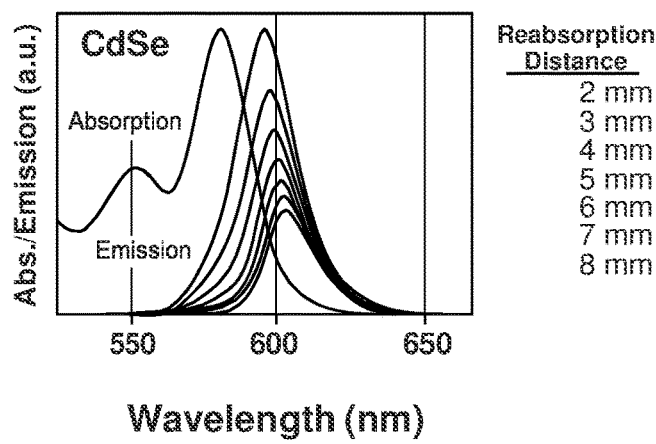
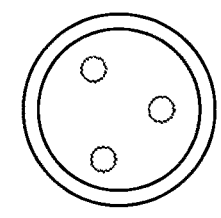
Doped Dot
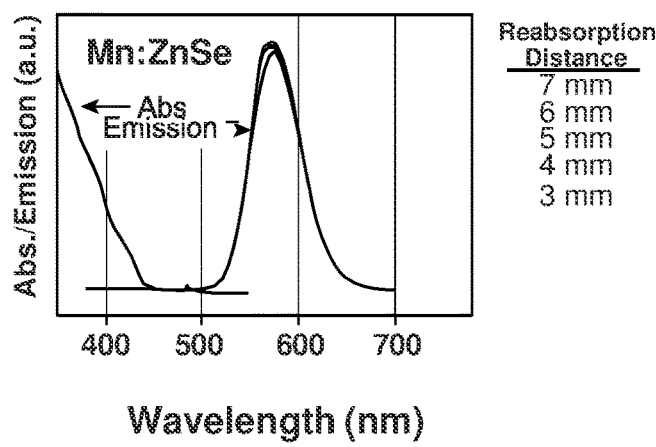
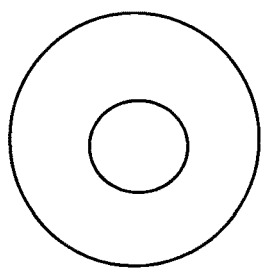
LR Dot
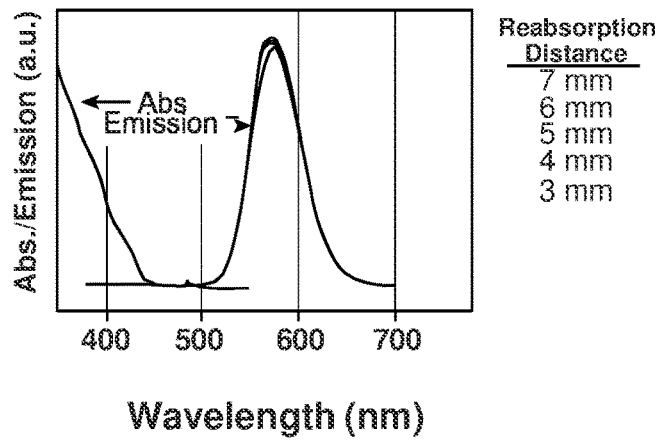

Fig. 3
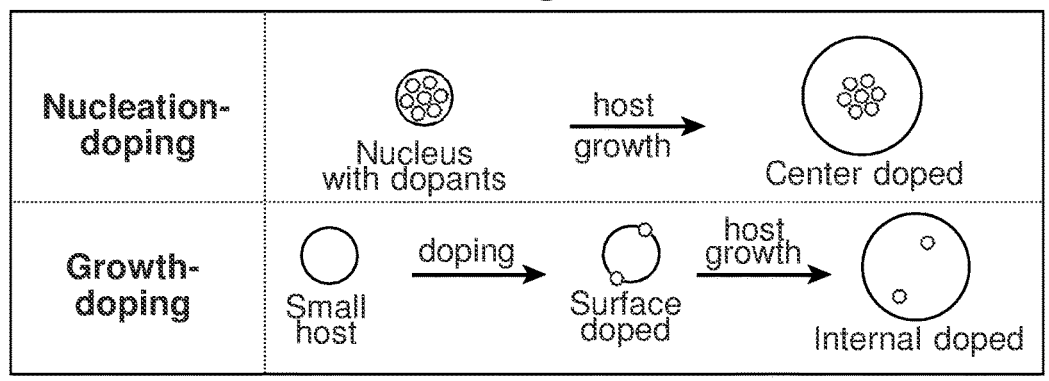
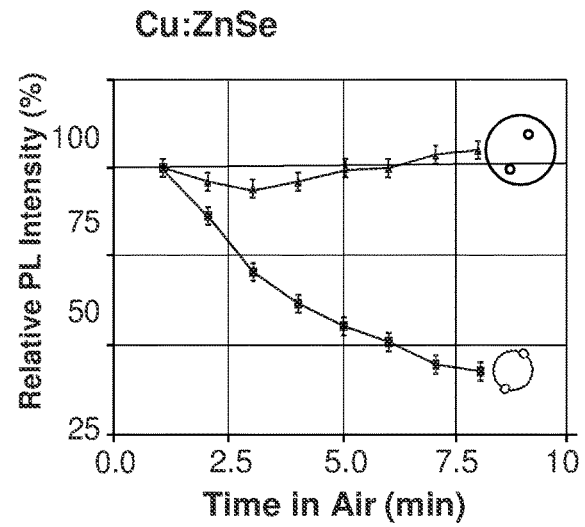

Fig. 5
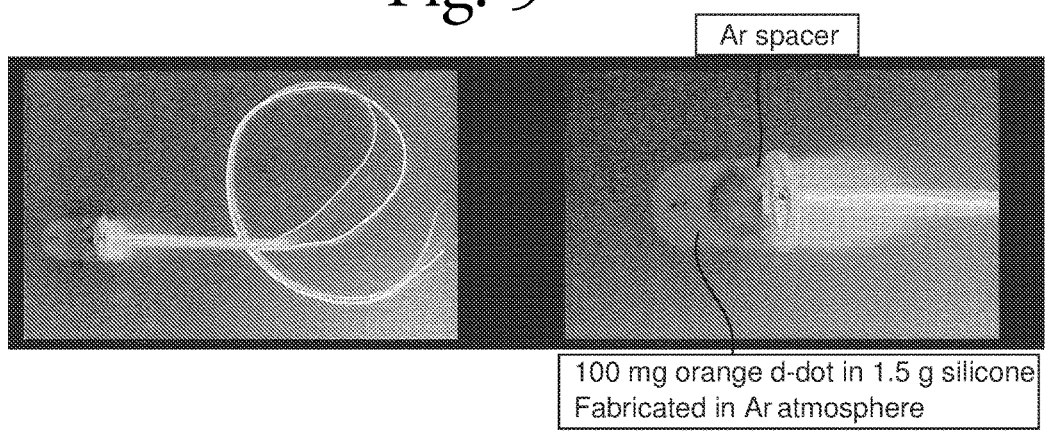
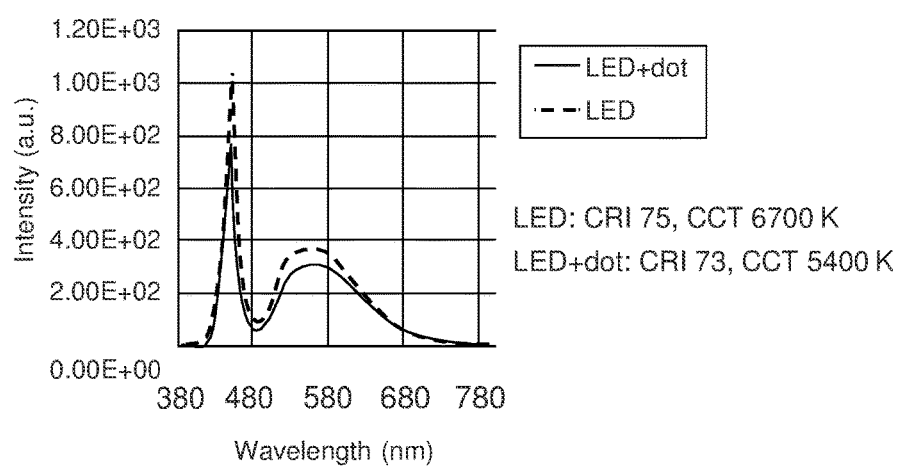

Fig. 6
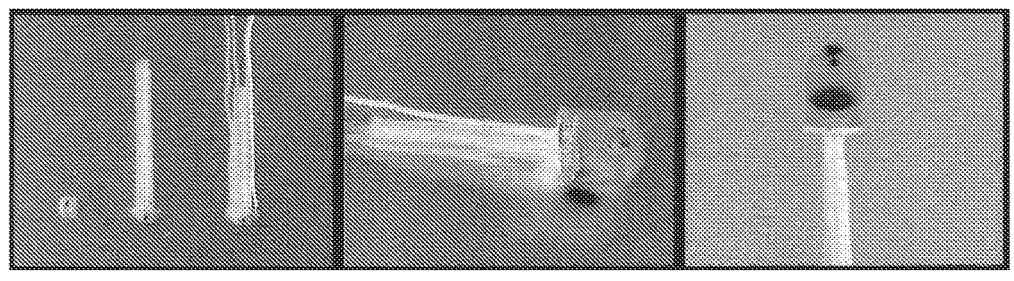
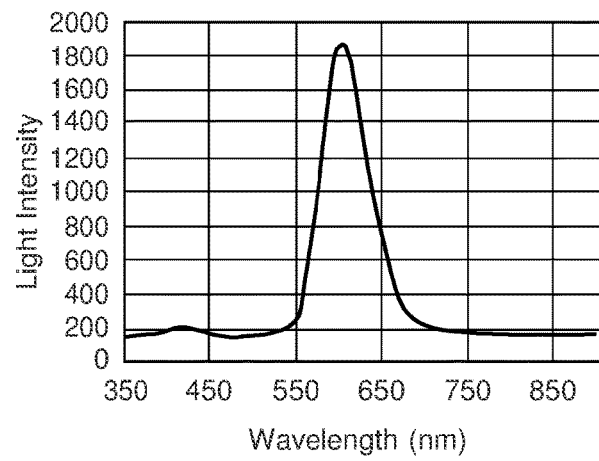

SEMICONDUCTOR NANOCRYSTALS USED WITH LED SOURCES

CROSS REFERENCE TO RELATED APPLICATIONS

This application is the national phase application of PCT/US2010/001871, entitled "SEMICONDUCTOR NANOCRYSTALS USED WITH LED SOURCES" filed on Jun. 30, 2010 under 35 U.S.C. 371, which claims priority to U.S. Provisional Patent Application Ser. No. 61/269,909 by T. Qiao et al., entitled "DOPED SEMICONDUCTOR NANOCRYSTALS USED WITH LED SOURCES", filed on Jun. 30, 2009, the disclosures of which are incorporated herein by reference.

FIELD OF THE INVENTION

The present invention relates to the use of light-converting, colloidal, semiconductor nanocrystals to provide a new generation of high performance, low cost monochromatic and white light sources based on light emitting diodes, also referred to herein by the abbreviation LEDs.

BACKGROUND OF THE INVENTION

Solid-state lighting for general illumination, particularly white LEDs, is being viewed by many as a means of meeting the world's growing needs for lighting, while reducing the associated energy costs. However, white LEDs often suffer from large variations in brightness due to the manufacturing process. Thus, the lighting community has asked the light emitting diode, also referred to herein by the abbreviation LED, industry to reduce the variance of white LEDs to enable luminaire-to-luminaire consistency. ("Lumileds Phosphor Technology Expected to Simplify Binning," LEDs Magazine web site, Aug. 7, 2007, http://www.ledsmagazine.com/news/4/8/4 (accessed Jun. 3, 2009)).

The main manufacturing steps in a LED manufacturing operation are known. Beginning with a substrate (typically silicon, sapphire or SiC), an epitaxial growth step is followed by lithography, etching and metallization and scribing, bonding, phosphor coating process steps. The combination of scribing, bonding, phosphor coating process steps processes and phosphor costs account for almost 87% of the total cost. Typical LED manufacturing operations require multiple dedicated metal organic chemical vapor deposition (MOCVD) lines to produce red, green and blue LEDs, respectively.

It is noted that the finished product comprises multiple layers, all of which are deposited metal organic chemical vapor deposition techniques (MOCVD). Typical LED growth runs take more than 5 hours, depending upon layer thickness and structure complexity. In a perfect world, the final chip is completely uniform in properties across the surface of the chip. In reality, however, due to imperfections resulting from the metal organic chemical vapor deposition (MOCVD) process and substrate properties such as curvature, LED properties vary significantly across the chip. In turn, this necessitates product separation known as binning, which is done as a function of brightness, color (emission wavelength) and forward voltage. Binning adds huge cost and complexity to the production operation, requiring an additional expensive step and, more importantly, significantly reducing yield.

For example, a typical metal organic chemical vapor deposition (MOCVD) machine will fabricate about 40000 wafers per year, however, roughly 10%, ca. 4000 wafer, will be discarded through the binning process due the unsatisfactory emission wavelengths that fall outside the stringent manufacturing specifications resulting from the variability of metal organic chemical vapor deposition (MOCVD) process. Assuming a cost of $100/wafer, the direct loss from this manufacture variability can be as high as $400000/year for a single metal organic chemical vapor deposition (MOCVD). A large LED manufacturer typically operates 50+ metal organic chemical vapor deposition (MOCVD) machines, thus the potential loss on an annual basis can be greater than $20M. Severe binning criteria can lead to the rejection of >90% of the LEDs.

Generally speaking, there are two basic methods of fabricating white LEDs: the phosphor-conversion method and the discrete color-mixing method. It should be noted that one other method exists, a hybrid method, which is actually a combination of the two aforementioned methods.

The phosphor-conversion method produces white light by coating a blue light-emitting LED die with a phosphor, which is typically yellow. In this case, a portion of the blue light is directly emitted while another portion of the blue light is down-converted to longer wavelengths by the phosphor. The blending of the original blue, short-wavelength radiation with the down-converted longer-wavelength radiation produces white light. The primary means of introducing the phosphor is by dispersing it within an epoxy resin surrounding the blue light-emitting die. In this technique, over half of the photons produced are diverted back to the die. A more efficient technique, the remote phosphor conversion technique has also been developed. This technique involves moving the phosphor away from the die and shaping the optic surrounding the die to efficiently extract the back-scattered photons.

In the discrete color-mixing method, white light is produced by discrete emissions from two or more different colored LED dies. While this method eliminates phosphor conversion losses, this method is viewed as complex and has limited achievable efficacy. Neither technique addresses the problems of wafer variability resulting in binning.

The problems associated with binning are well described in the prior art. For example, U.S. Pat. No. 7,687,816 B2 by E. W. B. Dias of IBM and U.S. Pat. Appl. No. 2010/0067229A1 by A. M Scotch et al. of Osram Sylvania describe the problem that certain types of LEDs, coated with a phosphor to generate white light, exhibit variations in color temperature due to differences in raw material sources, crystal growth, handling, storage conditions for the raw materials, and the other variables that go into the manufacturing process. Therefore, these LEDs need to be binned before use. Such binning processes significantly increase the cost of manufacturing the LEDs.

The process of binning is described very well in U.S. Pat. Appl. No. 2008/0036364A1 by Y. Li and Y. Dong of Internatix. Specifically, they describe the binning procedure in which the electroluminescent characteristics of each LED arrayed on a wafer is measured prior to dicing, after which the individual LEDs are sorted by (a) peak emission wavelength (b) peak intensity of emitted light and (c) forward voltage.

Three broad approaches to ensure consistent color output and overcome binning-related issues are described in the prior art. U.S. Pat. Appl. No. 2008/0036364A1 by Y. Li and Y. Dong of Internatix describes the use of a phosphor combination designed with the ability to correct or self-adjust the chromaticity of emitted light in response to variations in excitation. One phosphor of such 'smart' compositions shows a decrease in emission intensity with increasing excitation wavelength while the other shows an increase in emission intensity with increasing excitation wavelength. The problem with this solution is that, in reality, it is challenging to find such 'smart' combinations. In addition, this solution does not help with binning that is required due to variation in peak intensity of emitted light or forward voltage differences.

U.S. Pat. Appl. No. 2008/0036364, entitled "Two-phase yellow phosphor with self-adjusting emission wavelength", provides another method to deal with the binning problem, utilizing phosphors. However, existing rare-earth phosphors are insufficient to achieve high performance warm white light. Rare-earth phosphors induce back-scattering, with losses as high as 60%, and are difficult to mix as different colors have different excitation wavelengths and different temperature sensitivity/degradation characteristics. Narendran, N.; Gu, Y.; Freyssinier-Nova, J. P.; Zhu, Y., *Extracting phosphor-scattered photons to improve white LED efficiency*. Phys. Stat. Sol. 2005, 202(6) R60-R62.

U.S. Pat. Appl. No. 2007/0285378A1 by M. H. R. Lankhorst et al. describes an LED light source for LCD backlighting that recalibrates itself over time in order to maintain color and brightness uniformity. A solution contains clusters of red, green and blue LEDs, wherein each cluster generates a white light point. Each such cluster has its own controllable driver so brightness of each color cluster is separately controllable. In addition, optical sensors are arranged so that measured color and flux are compared to a stored target and the current to each RGB LED is then automatically adjusted to achieve the target level for each cluster. While this solution is effective, it is simply prohibitive in complexity and cost for most applications, and particularly for applications such as general illumination lighting which are highly cost sensitive.

U.S. Pat. Appl. No. 2007/0215890A1 by G. Harbers et al. of Philips Lumileds Lighting Company describes a white light LED comprising a blue LED over which is affixed a preformed red phosphor platelet and a preformed green phosphor platelet. The LED dies are separately binned in accordance with their light output characteristics and then carefully matched to phosphor platelets of different characteristics such that a consistent white point is generated. This approach is also effective but requires multiple testing steps (the LED dies and each of the phosphor platelets have to be separately characterized) and binning steps. In fact, rather than eliminating binning, it results in increased binning in order to meet the customer requirement of consistent color and intensity output.

Problem to be Solved

Reabsorption, intrinsic to current phosphors materials, is a key limiting problem for achieving high quality and high optical efficacy for white light sources based on LEDs. There remains a need for LED white light sources with improved color, intensity, stability, uniformity, and manufacturability at lower costs.

Binning, as currently conducted, is very expensive. Uniformity of color and intensity in light sources is difficult to achieve using existing growth processes. The use of semiconductor nanocrystals to control color and intensity moves the point of control from the growth/wafer manufacturing/processing step to the semiconductor nanocrystal addition/architecture step, making control easier, cheaper and faster.

SUMMARY OF THE INVENTION

The present invention relates to a light converting composition comprising semiconductor nanocrystals capable of receiving substantially all of the fixed wavelength range of light of a light source and converting said fixed wavelength range of light to at least one different wavelength range of light. The present invention also relates to an LED source comprising an LED wafer and at least one layer of a light converting composition comprising semiconductor nanocrystals capable of receiving substantially all of the light of the LED wafer and converting said light of the LED wafer to at least one different wavelength range of light, as well as a device comprising an LED light source in combination with a light converting composition comprising semiconductor nanocrystals capable of receiving substantially all of the light of said LED light source and converting it to at least one different wavelength range of light.

Advantageous Effect of the Invention

The present invention includes several advantages, not all of which are incorporated in a single embodiment.

Semiconductor nanocrystals, as band-gap absorbers, demonstrate very high absorbances with no back-scattering, as these are less than 10 nm in size, and can use a single excitation frequency wherein multiple colors can be mixed in any proportion to yield high performance lighting without adverse temperature sensitivity. In turn, this provides tremendous LED design flexibility as well as the ability to use LEDs with emission frequencies wherein the intrinsic efficiency of the LEDs is highest.

In comparison to other down-conversion luminescence materials, including rare earth based phosphors and intrinsic quantum dots, the semiconductor nanocrystals according to the present invention possess several unique and outstanding advantages for solid state lighting, abbreviated herein as SSL, applications, such as high photoluminescence (PL) quantum yield (QY>85%), continuously tunable emission peak position, very good thermal stability in both color and intensity, high absorption cross-section, zero scattering, and zero self-quenching. These properties of the semiconductor nanocrystals utilized in the present invention enable superior lighting performance, greater product design flexibility, simplified manufacturing operations and substantially reduced manufacturing costs.

BRIEF DESCRIPTION OF THE DRAWINGS

FIG. 1 represents emission spectra of heavy metal-free doped semiconductor nanocrystals. TOP: photoluminescence (PL) spectra of ZnSe-based in blue, yellow, green, and orange colors. BOTTOM: Cu:InP d-dots in orange, red and near infrared colors. MIDDLE: Pictures of 3 d-dot samples under UV radiation.

FIG. 2 UPPER represents self-quenching in intrinsic quantum dots. MIDDLE represents large Stokes shift (zero self-quenching) in d-dots. LOWER represents large Stokes shift (zero self-quenching) in LR dots.

FIG. 3 represents TOP: schematic illustration of inventive doping technologies, which dope all nanocrystals at a controlled location (*JACS* 2005, *JACS* 2007, *JACS* 2009) and highlighted in 2005 and 2007 by *Science*; BOTTOM LEFT: outstanding thermal stability of ZnSe-based d-dots; BOTTOM RIGHT: comparison of chemical stability of surface and internal doped d-dots.

FIG. 5 represents another embodiment of a device according to the present invention.

FIG. 6 represents yet another embodiment of a device according to the present invention.

DETAILED DESCRIPTION OF THE INVENTION

Figure 4:
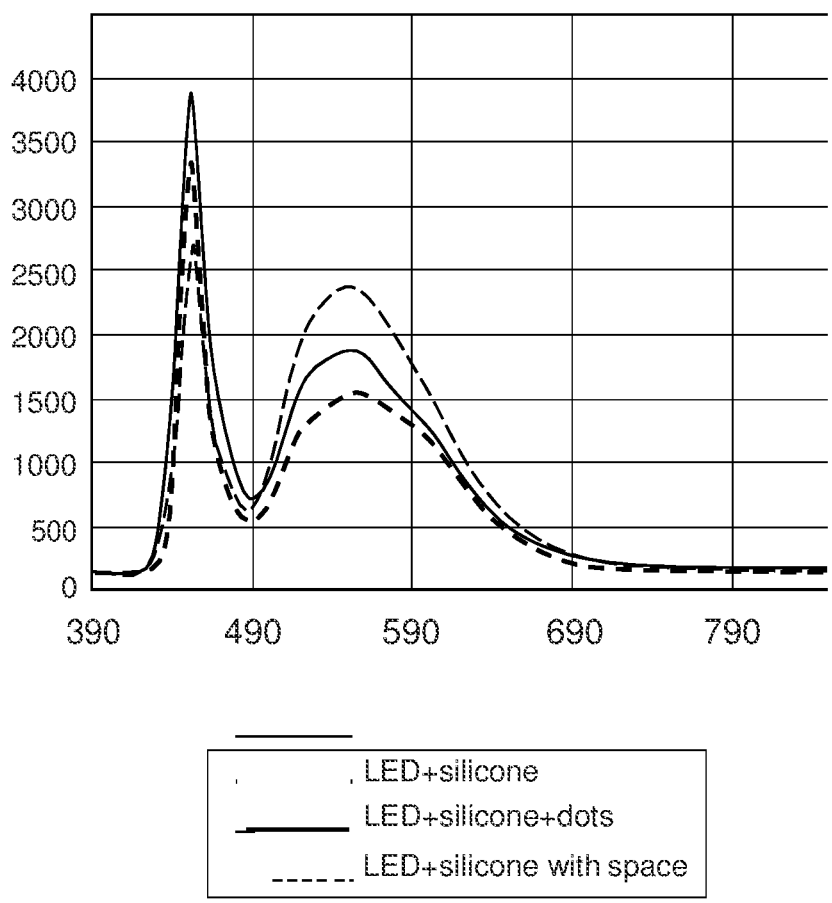
FIG. 4 represents one embodiment of a non-contact device according to the present invention.
Figure 7:
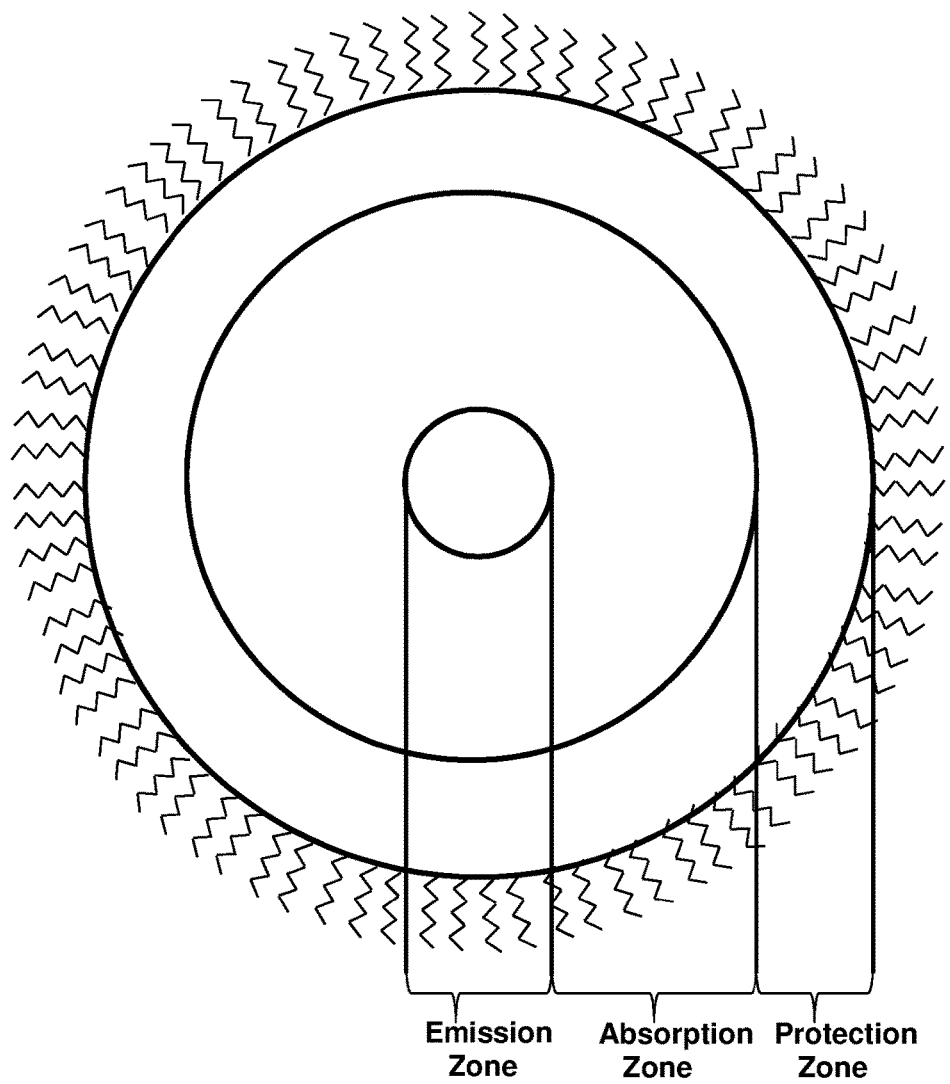
FIG. 7 represents the schematic diagram of the LR dot structure, including emission zone (core), and absorption zone (inner shell). Also illustrated are the optional protection zone (outer shell) and an optional ligand treatment on the outer surface of the nanocrystals.

The present invention relates to a light converting composition comprising semiconductor nanocrystals capable of receiving a fixed wavelength range of light and converting it to at least one different wavelength range of light. The semiconductor nanocrystals can be doped semiconductor nanocrystals or semiconductor nanocrystals specifically designed to have separate regions of the nanocrystal dedicated to emission and absorption. Preferably, this designed semiconductor nanocrystal has an emission-center core and at least one absorbing alloy shell. The present invention also relates to a device comprising an LED source with a light converting composition of semiconductor nanocrystals, wherein the semiconductor nanocrystals absorb substantially all of the emission from the LED source, as well as a device comprising an LED source with a light converting composition of semiconductor nanocrystals, wherein substantially all of the emission of the device is emitted from the semiconductor nanocrystals.

The present invention describes a new generation of high performance, low cost monochromatic and white light sources based on LEDs via down-conversion using colloidal semiconductor nanocrystals. Specifically, commercial LED manufacturing methods today require multiple dedicated metal organic chemical vapor deposition (MOCVD) operations and binning post-manufacture, adding capital/operating expense and reducing product yields. This description demonstrates the feasibility and impact of moving the point of color control in the LED manufacturing operation from the metal-organic expitaxial growth process to a subsequent operation incorporating semiconductor nanocrystals. The present invention provides strong impetus for transformative changes in LED architectures and manufacturing methods.

By shifting the point of color control from the intrinsic LED to the semiconductor nanocrystals, one can simplify the manufacturing operation to produce only a single color LED and then use mixtures of doped semiconductor nanocrystals or semiconductor nanocrystals specifically designed to have an emission-center core and at least one absorbing alloy shell to achieve any desired color with improved yields, precise color control and greater design flexibility. In this way, we can imagine a future LED manufacturing operation based on a single metal organic chemical vapor deposition (MOCVD) to produce 405-420 nm chips, followed by coating operation(s) for blue, green, yellow, orange, or red color semiconductor nanocrystals for single color LEDs, or a blend of two, three or more colored semiconductor nanocrystals to produce white LEDs. The semiconductor nanocrystals utilized in the present invention possess unique properties such as continuously and precisely tunable emission, flexible excitation, zero scattering, zero self-quenching, etc. These properties enable superior lighting performance and greater LED design flexibility than commercial rare-earth phosphors. In addition, these properties potentially enable simplified manufacturing operations and increased manufacturing yields. The unique absorption and emission properties of doped semiconductor nanocrystals (commonly referred to herein as d-dots) or semiconductor nanocrystals specifically designed to have an emission-center core and at least one absorbing alloy shell (commonly referred to herein as LR dots) make these materials ideally suited to solve the binning problem in LED chip emission wavelength variation.

The central idea lies in the fact that doped semiconductor nanocrystals or semiconductor nanocrystals specifically designed to have an emission-center core and at least one absorbing alloy shell for use in the present invention have excellent absorption below 460, particularly less than 430 nm, and emit in a precise and continuously tunable peak position, illustrated for doped semiconductor nanocrystals in FIG. 1. Therefore, wafers manufactured with emission in the range of 405-420 nm combined with these specific semiconductor nanocrystals should produce LEDs with exactly the same emission wavelength regardless of variability in the intrinsic emission from the LED. Thus, emission wavelength-based binning can be eliminated.

Doped semiconductor nanocrystals with different emission colors, as shown in FIG. 1, can be efficiently excited by a single LED with emission in the range of 405-420 nm. This feature is evident from FIG. 2, which compares absorption and emission from doped semiconductor nanocrystals (Mn doped ZnSe as an example), with absorption and emission from intrinsic quantum dots. As used herein, an intrinsic quantum dot is defined as a semiconductor nanocrystal whose electronic properties are dictated by its band structure, including conduction band, valence band, bandgap. Unlike intrinsic quantum dots, absorption of doped semiconductor nanocrystals comes from the semiconductor host while emission is controlled by the dopant. As used herein, the semiconductor host is defined as the semiconductor nanocrystal material which completely dictates the absorption properties. The decoupling of excitation and emission in doped semiconductor nanocrystals, as shown in FIG. 2 (middle and bottom), results in a large Stokes' shift (well separated absorption and emission bands) reducing self-quenching of the emission to zero. Conversely, the intrinsic excitonic emission of quantum dots (FIG. 2, top) shows substantial self-quenching. See Pradhan, N.; Goorskey, D.; Thessing, J.; Peng, X., *An Alternative of CdSe Nanocrystal Emitters: Pure and Tunable Impurity Emissions in ZnSe Nanocrystals*. Journal of the American Chemical Society 2005, 127 (50), 17586-17587; Pradhan, N.; Peng, X., *Efficient and Color-Tunable Mn-Doped ZnSe Nanocrystal Emitters Control of Optical Performance via Greener Synthetic Chemistry*. Journal of the American Chemical Society 2007, 129 (11), 3339-3347.

Alternatively, a large Stokes' shift can be also obtained using specially designed intrinsic quantum dots, so-called low-reabsorption quantum dots (LR dots). As used herein, "reabsorption" refers to a process in which the emission from one emitter is optically absorbed again by the same type of emitter or a different type of emitter. Similar to d-dots, LR dots possess separate absorption and emission centers with an additional outer protection zone (such a protection zone can also be engineered for a d-dot as well). Typically, the emission center (low bandgap semiconductor) is placed in the middle or core of a LR dot and the absorption zone (medium bandgap semiconductor) is epitaxially grown onto the emission core. The protection zone (wide bandgap semiconductor or insulator) at the outmost shell of the LR dot provides needed chemical and photo-stability for the LR dots. Because the bandgap of the emission center is significantly narrower than that of the absorption zone and the absorption zone has a significantly large absorption cross-section in comparison with the emission center, the emission spectrum and absorption spectrum of the LR dot sample is well separated. By tuning the composition and structure of the LR dots, one can readily vary the emission color of the resulting LR dots. In other words, a LR dot's emission color is similar to a d-dot, which is not tightly related to the size of the dot (or, not only dependent on the size of the dot). Instead, the composition and structure along with the physical dimension dictate the optical properties of both d-dots and LR dots. In this sense, d-dots and LR dots are interchangeable in the presently described applications.

It is noted that even if traditional phosphors can be fabricated in nanocrystalline form with the same emission efficiency, their absorption properties will still fall short in comparison to doped semiconductor nanocrystals or semiconductor nanocrystals specifically designed to have an emission-center core and at least one absorbing alloy shell. The emission of doped semiconductor nanocrystals is from the atomic levels of the dopant ions while their absorption comes from the excitonic excitation of the semiconductor host nanocrystals. As a comparison, the extinction coefficient of exciton absorption is typically five orders of magnitude higher than that of the bulk inorganic phosphors. Peng, X., An Essay on Synthetic Chemistry of Colloidal Nanocrystals. Nano Research 2009, 2 (in press).

Colloidal semiconductor nanocrystals are nanometer-sized fragments of the corresponding bulk crystals, which have generated fundamental interest for their promise in developing advanced optical materials. In the past, scientists and engineers paid close attention to the size-dependent emission of semiconductor nanocrystals. Differently sized nanocrystals can be prepared that emit from a specific color range, with comparatively pure color emissions. In this invention, however, the emission color of the semiconductor nanocrystals is not solely determined by the size of the semiconductor nanocrystals. In order to achieve desired optical performance in the devices, the emission color of the semiconductor nanocrystals will be mainly tuned by composition and structure of the semiconductor nanocrystals although their size sometimes remains as one of the means for color tuning.

Types of semiconductor nanocrystals include plain core nanocrystals and nanocrystalline cores coated with at least one layer of another semiconductor material, commonly referred to as core/shell nanocrystals. The shell layer(s) may be the same or different from the nanocrystalline core material. Core/shell nanocrystals are likely to be the desired structures when the nanocrystals either undergo complicated chemical treatments, such as in bio-medical applications, or when the nanocrystals are constantly excited, such as for LEDs and lasers. Core/shell nanocrystals are representative of a number of different complex structured nanocrystals, such as core/shell/shell structured materials, the architectures of which are aimed at providing fine control over the nanocrystal's photophysical properties. Both d-dots and LR dots which are desired for the devices disclosed in this invention are mostly likely in a form of core/shell structure.

Core/shell semiconductor nanocrystals, in which the core composition differs from the composition of the shell that surrounds the core, are useful for many optical applications. If the band offsets of the core/shell structures are type-I, and the shell semiconductor possesses a higher bandgap than the core material does, then the photo-generated electron and hole inside a nanocrystal will be mostly confined within the core. As used herein, type-I band offsets refer to a core/shell electronic structure wherein both conduction and valence bands of the shell semiconductor are simultaneously either higher or lower than those of the core semiconductor.

Conventional core/shell nanocrystals can show high photoluminescence (PL) and electroluminescence efficiencies and can be more stable against photo-oxidation than "plain core" semiconductor nanocrystals comprising a single material, provided that the bandgap of the core semiconductor is smaller than that of the shell semiconductor.

The core is a semiconductor nanocrystalline material, typically the combination of a metal and a non-metal. In the case of d-dots, however, the core may be a combination of three or more elements. In addition to the host metal and non-metal, dopant ions may be included in this core. The core is prepared by combining a cation precursor(s) with an anion precursor(s). The metal for the host (or the plain core) is most preferably selected from Zn, Cd, Hg, Ga, In, Ti or a rare earth. The term rare-earth or rare-earth metal, as used herein, refers to the lanthanides, the actinides, and Sc, Y, and La. Thus, in this aspect, Sc, Y, and La are encompassed by the terms transition metal and rare-earth metal. The non-metal is most preferably selected from O, S, Se, P, As, or Te. The cationic dopant ions could include all transition metals and rare earth elements, and the anionic dopant ions may be chosen from O, S, Se, Te, N, P, As, F, Cl, and Br. As used herein, transition metals include, but are not limited to, Ti, Zr, Hf, V, Nb, Ta, Cr, Mo, W, Mn, Tc, Re, Fe, Ru, Os, Co, Rh, Ir, Ni, Pd, Pt, Cu, Ag, and Au. Also as used herein, including in the context of providing core materials, Sc, Y, and La are also considered transition metals.

The cation precursors can comprise elements or compounds, for example, elements, covalent compounds, or ionic compounds, including but not limited to, oxides, hydroxides, coordination complexes or metal salts, which serve as a source for the electropositive element or elements in the resulting nanocrystal core or shell material.

The cation precursor solution can comprise a metal oxide, a metal halide, a metal nitride, a metal ammonia complex, a metal amine, a metal amide, a metal imide, a metal carboxylate, a metal acetylacetonate, a metal dithiolate, a metal carbonyl, a metal cyanide, a metal isocyanide, a metal nitrile, a metal peroxide, a metal hydroxide, a metal hydride, a metal ether complex, a metal diether complex, a metal triether complex, a metal carbonate, a metal phosphate, a metal nitrate, a metal nitrite, a metal sulfate, a metal alkoxide, a metal siloxide, a metal thiolate, a metal dithiolate, a metal disulfide, a metal carbamate, a metal dialkylcarbamate, a metal pyridine complex, a metal bipyridine complex, a metal phenanthroline complex, a metal terpyridine complex, a metal diamine complex, a metal triamine complex, a metal diimine, a metal pyridine diimine, a metal pyrazolylborate, a metal bis(pyrazolyl)borate, a metal tris(pyrazolyl)borate, a metal nitrosyl, a metal thiocarbamate, a metal diazabutadiene, a metal dithiocarbamate, a metal dialkylacetamide, a metal dialkylformamide, a metal formamidinate, a metal phosphine complex, a metal arsine complex, a metal diphosphine complex, a metal diarsine complex, a metal oxalate, a metal imidazole, a metal pyrazolate, a metal-Schiff base complex, a metal porphyrin, a metal phthalocyanine, a metal subphthalocyanine, a metal picolinate, a metal piperidine complex, a metal pyrazolyl, a metal salicylaldehyde, a metal ethylenediamine, a metal triflate compound, or any combination thereof. Preferably, the cation precursor solution can comprise a metal oxide, a metal carbonate, a metal bicarbonate, a metal sulfate, a metal sulfite, a metal phosphate, metal phosphite, a metal halide, a metal carboxylate, a metal hydroxide, a metal alkoxide, a metal thiolate, a metal amide, a metal imide, a metal alkyl, a metal aryl, a metal coordination complex, a metal solvate, a metal salt, or a combination thereof. Most preferably, cation precursor is a metal oxide or metal salt precursor and can be selected from zinc stearate, zinc myristate, zinc acetate and manganese stearate.

Anion precursors can also comprise elements, covalent compounds, or ionic compounds that serve as a source for the electronegative element or elements in the resulting nanocrystal. These definitions anticipate that ternary compounds, quaternary compounds, and even more complex species may be prepared using the methods disclosed herein, in which case more than one cation precursor, more than one anion precursor, or both, may be used. When dual or multiple cation elements were used in the growth of a given monolayer, the resulting nanocrystals were cation-doped at the given monolayer if the other part of the nanocrystals contained only a single cation. The same method can be used for the preparation of anion-doped nanocrystals.

In one aspect of this invention, the methods disclosed herein are applicable to core/shell nanocrystals prepared using a range of cation precursor compounds for the core and the shell material, for example, precursors of the group II metals (for example, Zn, Cd, or Hg), the group III metals (for example, Al, Ga, or In), the group IV metals (for example, Ge, Sn or Pb), or the transition metals (including, but not limited to, Ti, Zr, Hf, V, Nb, Ta, Cr, Mo, W, Mn, Tc, Re, Fe, Ru, Os, Co, Rh, Ir, Ni, Pd, Pt, Cu, Ag, Au, and the like). As used herein, the term II/VI compound or II/VI material refers to a compound comprising a group II element (also referred to as a group 12 element) and a group VI element (also referred to as group 16 element). Also as used herein, the term MN compound or III/V material refers to a compound comprising a group III element (also referred to as a group 13 element) and a group V element (also referred to as group 15 element).

The preferred core material may be selected from CdSe, CdS, CdTe, CdO, ZnSe, ZnS, ZnO, ZnTe, HgSe, HgS, HgTe, HgO, GaAs, GaP, InP, InAs, $In_2O_3$, TiO2 or a rare earth oxide, or a chemically allowed mixture of these compounds, or one of these compound and mixtures doped with cations or anions. The core can comprise a II/VI compound or a III/V compound. The preferred group II elements are Zn, Cd, or Hg and the preferred group VI elements are O, S. Se, or Te. The preferred group III elements are B, Al, Ga, In, or Tl and the preferred group VI elements are N, P, As, Sb, and Bi.

The shell material is typically the same type of material chosen for the core. The composition of the shell or shells may be the same or different than the composition of the core allow a narrow size distribution of core/shell nanocrystals to be attained as the growth of a shell material proceeds.

In this aspect, essentially all the shell precursor material added into a solution of the core nanocrystals grows exclusively onto the core nanocrystals. Again, while not intending to be bound by theory, it is believed that nearly monodisperse core/shell and other complex structured nanocrystals have also been possible by, among other things, shell growth that not only proceeds at substantially the same rate, but also initiates at substantially the same time at each nanocrystalline core site.

The solution phase epitaxial method achieves growth of the shell material onto the core material typically one monolayer per reaction cycle, by alternating injections of the cationic and anionic solutions into the reaction mixture. One reaction cycle refers to two consecutive injections of the reaction precursors, one for the cationic (anionic) precursor solution and the following one for the anionic (cationic) precursor solution.

For a typical nanocrystal, the core can have a dimension of from about 1 to 10 nm, the inner shell layer(s) can have a thickness of from about 1 to 100 nm, and the exterior protection layer can have a thickness of from about 1 to 1000 nm.

Preferred core/shell nanocrystal structures are both nanometer-sized and somewhat monodisperse and may include, but are not limited to CdSe/ZnSe, CdSe/ZnS, InP/CdS, InAs/CdS, InAs/InP, InAs/CdSe, CdS/CdSe, CdS/InP, CdS/CdSe/CdS, CdSe/ZnS/CdSe, CdSe/ZnS/CdSe/ZnS, MnSe/ZnSe, MnSe/ZnSe/ZnS, ZnSe/ZnS, alloys (mixtures) of these possible compositions, as well as doped-ZnSe/ZnSe, doped-ZnS/ZnSe, and the like. For d-dots, the "as-prepared" particles are pure doped nanocrystals, indicated by the pure dopant emission (>99%). The term "as-prepared", as used herein, generally refers to samples of nanocrystals that are used without purification or size-selection methods. Specifically, an "as-prepared" nanocrystal refers to the nanocrystals without the removal of any unreacted reactants and/or other side products from the original reaction mixture.

Although not limited to II-VI and III-V semiconductors, the complex nanocrystals disclosed here can be readily realized using these two families of semiconductors and their alloys. They have similar crystal structure and tunable lattice constants. Furthermore, these two families of semiconductors are mostly direct bandgap.

As semiconductor nanocrystals are below 10 nm in diameter, they do not scatter light upon proper dispersion in suited optical polymers. Traditional phosphors are typically micron-sized and scattering losses can be as high as 50%.

The preferred semiconductor nanocrystals for use in the present invention are doped semiconductor nanocrystals or semiconductor nanocrystals specifically designed to have an emission-center core and at least one absorbing shell and at least one protection shell. Because of their unique absorption and emission properties pre-determined by their unique physical structure and compositions, the latter type of inventive semiconductor nanocrystals are also referred to herein as low reabsorption (LR) dots.

Doped nanocrystals are unique nanomaterials in many ways. Without them, nano-sized p-n junctions needed for nanostructured solar cells and electronics may not have been produced. Doped semiconductor nanocrystals as an emitter can maintain most of the advantages of intrinsic nanocrystals, simple requirements for excitation, tunable emission position by varying the dopants, strong and stable emission, general surface chemistry; etc. There are numerous publications for the synthesis of doped bulk semiconductors and nanocrystals. Of particular relevance to this invention are doped semiconductor nanocrystals described in U.S. Pat. No. 7,632,428 B2 by Peng et al. The doped nanocrystal as produced according to Peng shows the characteristic of a semiconductor, which can be used as a biological labeling reagent, a light-emitting-diodes (LED), a solar cell, an electronic device such as a solid state lighting device, and the like.

In one embodiment, the doped nanocrystal useful to this invention comprises a core of a first semiconductor material with an outer surface and a layer of a second semiconductor substantially enclosing the outer surface of the core of the first semiconductor material. A third or additional layer(s) of a third or additional semiconductors, with or without dopant, can also be grown over the layer of the second semiconductor.

The core of the first semiconductor material is formed with at least one metal dopant doped into a non-metal precursor, wherein the non-metal precursor can be selected from the group consisting of Se, Te and S. The metal oxide or metal salt precursor can be selected from zinc stearate, zinc myristate, zinc acetate and manganese stearate. The non-metal precursor can also be selected from the non-metal elements in Group V, Group VI, and Group VII, wherein the non-metal at least includes one of N, P, As, O, S, Se, Te, CI, Br, and I. The metal oxide or metal salt precursor can also be selected from a Group I, Group II, Group III, Group IV and group V metal or a transition metal, wherein the transition metal at least includes one of Cd, Zn, Hg, Cu, Ag, Ni, Co, Fe, Mn, Ti, Zr, and rare earth elements, the group IV metal at least includes one of Sn and Pb, and the group V metal at least include Al, Ga, and In. One or more non-metal dopants can also be doped into the core of the first semiconductor.

Each of the first semiconductor, the second semiconductor, the third, and additional semiconductors is preferably a group IV semiconductor, a group II-VI semiconductor or a group III-V semiconductor, wherein the group IV semiconductor is selected from Si, Ge, and Sn, the group II-VI semiconductor is selected from ZnSe, ZnO, ZnS, MnSe, CuS, CuSe, CuTe, CaS, CaTe and CaSe, and the group III-V semiconductor is selected from GaN, GaP and GaAs, InN, InP, and InAs. The first semiconductor and the second semiconductor can be either different or substantially the same, wherein the core of first semiconductor material has a dimension of from about 1 to 100 nm, and the layer of a second semiconductor has a thickness of from about 1 to 1000 nm.

These are core-doped and shell-doped nanocrystals with pure dopant photoluminescence (PL) (>99%), a useable PL quantum yield, are stable under high temperatures, and are compatible with commonly known ligand chemistry. Examples of such nanocrystals are disclosed although these examples do not limit the possibilities of other structures, different dopants and/or different hosts. The methods for making these new structures are unique, which allows doping to occur either in nucleation phase or growth phase. The invention has been demonstrated in a simple one-pot configuration and can also be performed in separated steps in multi-pot configurations. These new inventive aspects also allow the creation of new compositions, more complex doped nanocrystals, such as multiple types of dopants in different locations of the core and different positions of the shell. The local host for different dopants can also be isolated by growing a barrier layer between two local hosts.

The present invention relates to complex structured doped nanocrystals, wherein the doping is effected in a given radial position. These "radially-doped" nanocrystalline materials are of interest for, among other things, spintronics, atomic emitting materials, and the like. As used herein, "radially-doped" refers to complex-structured, doped nanocrystals, wherein the doping is effected in a given radial position in the nanocrystal in a controlled fashion. The dopant may be selected from a transition metal, a rare earth metal, or a mixture thereof. Some preferred dopants include Mn, Fe, Co, Ni, Pd, Pt, Cu, Al, Ag, or Au, or a rare earth metal.

The preferred radially-doped core/shell or multiple shell nanocrystals can comprise $ZnSe/Zn_{d-f}M^4_fSe/ZnSe$, $ZnSe/Zn_{d-f}M^4_fSe/ZnS$, $ZnO/Zn_{d-f}M^4_fO/ZnO$, $ZnO/Zn_{d-f}M^4_fO/ZnS$, $TiO_2/Ti_{d-f}M^4_fO_2/TiO_2$, and wherein $M^4$ is selected from Mn, Fe, Co, Ni, Pd, Pt, Cu, Al, Ag, or Au, or a rare earth metal.

The concentration of the dopant in a doped nucleus or core can be adjusted by varying the ratio of the metal oxide or metal salt precursor and/or the chalcogenic precursor to the metal dopant, wherein the concentration of the dopant in a doped nucleus or core is in the range of 0 to 100 atomic percent.

A preferred ratio of dopant in the doped nanocrystal—the ratio between the dopant ion and the host ion—is in the range of from 1:1000000 to 1:5, but is not limited to this range. Alternatively, each doped nanocrystal could have at least one dopant ion but not more than 30% of dopant ions.

The photoluminescence properties of radially-doped semiconductor nanocrystals are outstanding for the targeted technology. The photoluminescence (PL) quantum yield of Mn doped ZnSe (Mn:ZnSe) dots with orange color emission (PL peak tunable from 590 to 620 nm), has reproducibly reached 85%. The key is that every dot is doped and the dopant ions are placed away from the surface of the dot. Conversely, the prior art doped dots cannot dope every dot because of the rough dopant strategy. It should be pointed out that, before development of our patented technologies, the highest photoluminescence (PL) quantum yield reported in literature and patents for doped semiconductor nanocrystals was around 20%. Bhargava, R. N.; Gallagher, D.; Hong, X.; Nurmikko, A., *Optical properties of manganese-doped nanocrystals of zinc sulfide*. Physical Review Letters 1994, 72 (3), 416-19; Norris, D. J.; Yao, N.; Charnock, F. T.; Kennedy, T. A., *High-Quality Manganese-Doped ZnSe Nanocrystals*. Nano Letters 2001, 1(1), 3-7. The one-pot approaches comprise inherently "greener synthesis routes" (fewer materials, reduced use of hazardous materials, greater yields) and allow the decoupling of the doping process from nucleation and/or growth processes. Pradhan, N.; Goorskey, D.; Thessing, J.; Peng, X., *An Alternative of CdSe Nanocrystal Emitters: Pure and Tunable Impurity Emissions in ZnSe Nanocrystals*. Journal of the American Chemical Society 2005, 127 (50), 17586-17587.

LEDs under operation generate heat. Typical operating temperatures range from 50-80° C. The thermal stability of color conversion elements is critical. Intrinsic quantum dots (q-dots) tend to be temperature sensitive, losing their emission above 80° C. and, as such, are not suitable for LED applications. Peng, X., An Essay on Synthetic Chemistry of Colloidal Nanocrystals. Nano Research 2009, 2 (in press). Doped semiconductor nanocrystals, by contrast, tend to be stable to high temperature. As shown in FIG. 3, both the emission intensity and the emission color of q-dots change substantially upon heating, although the corresponding doped semiconductor nanocrystals show no sign of peak shift and spectral drifting. See Pradhan, N.; Goorskey, D.; Thessing, J.; Peng, X., *An Alternative of CdSe Nanocrystal Emitters: Pure and Tunable Impurity Emissions in ZnSe Nanocrystals*. Journal of the American Chemical Society 2005, 127 (50), 17586-17587; Pradhan, N.; Peng, X., *Efficient and Color-Tunable Mn-Doped ZnSe Nanocrystal Emitters: Control of Optical Performance via Greener Synthetic Chemistry*. Journal of the American Chemical Society 2007, 129 (11), 3339-3347.

With these interesting properties, it is conceivable that a single purple/blue LED chip with emission in the range of 405-420 nm can be used to excite a variety of doped semiconductor nanocrystals or semiconductor nanocrystals specifically designed to have an emission-center core and at least one absorbing alloy shell to generate blue, green, yellow, orange, and red colors. It is also conceivable that a white LED can be generated from the same 405-420 nm LED with a blend of doped semiconductor nanocrystals or semiconductor nanocrystals specifically designed to have an emission-center core and at least one absorbing alloy shell.

Since these semiconductor nanocrystals are able to absorb all light from the source, the variability in LED emissive color can be finely controlled by down-converting all photons from 405-420 nm to a single emissive color from the re-emission of doped semiconductor nanocrystals. This total down-conversion process would enable a much higher tolerance in LED chip emission wavelength variability during a metal organic chemical vapor deposition (MOCVD) process and still achieve very tight emission wavelength control via the use of the described semiconductor nanocrystals. This scheme can enable future LED manufactures to use a single metal organic chemical vapor deposition (MOCVD), for example, 405-420 nm, but also simplify the LED manufacturing process and reduce the need for binning in LED emission wavelength.

The light from the source can be converted to a single color range different from the range of the source, such as red, blue, yellow, orange, and green, at least two wavelength ranges or a combination of any two of the colors, at least three wavelength ranges or a combination of any of at least three of the colors, etc. In one embodiment, a single type of nanocrystal is used. In another embodiment, a combination of at least two nanocrystals is used. The nanocrystals may have a common host core material, but utilize different dopants.

The present invention also preferably utilizes semiconductor nanocrystals having, simultaneously, an emission center surrounded by at least one absorbing shell and, most preferably, also a protective exterior shell. The inventive semiconductor nanocrystals may be referred to herein as low reabsorption (LR) semiconductor nanocrystals, or simply as LR dots. The LR dots can have an internal compositional gradient, which provides both optimal absorption and emission, which should separate the main absorption band from the emission peak and which possess high absorption coefficient at the excitation wavelength as well as high photoluminescence (PL) quantum yield. The LR dot is physically divided into three different zones: one emission zone (usually the core), one absorption zone (usually inner shell(s)), and a protection zone (the outer shell). There is the possibility of some overlap between adjacent zones. In terms of lattice matching, this invention centers the entire design around the absorption zone, which is different from existing core/shell/shell nanocrystals.

For example, when the excitation comes from a typical blue LED for solid-state-lighting in the wavelength range between 440 and 470 nm, CdS is a good choice for the absorption zone. As another example, if the excitation is from a purple LED for making a red LED through frequency down-conversion, ZnSe or $ZnSe_xS_{1-x}$ is a good candidate as the absorption zone. For a third example, if one wants to obtain near infrared emission from quantum dots for biomedical applications (700-1000 nm) by using a red light source, CdSe could work as the absorption zone.

In typical core shell quantum dots, the core is designed for absorption and emission while the shell is designed for protection. According to the present invention, the dots have a core, middle shell and outer shell. In this design the middle layer provides the absorption while the core provides the emission. These nanocrystals behave like doped quantum dots, where the host provides the absorption and the dopant provides the emission, but the present quantum dots are 'intrinsic quantum dots'—without any dopant. A graded shell can minimize the interface defects between the core and shell materials by improving lattice matching and reducing lattice strain within a quantum dot according to the present invention, especially at the interface between its emission zone and absorption zone.

The main advantage of the present design in terms of function is that the semiconductor nanocrystals minimize undesired quenching through reduced reabsorption energy transfer. This advantage is desirable for any application when a high concentration of nanocrystals, a close proximity between nanocrystals, and/or a long optical path length are needed. However, this advantage is substantial only if the emission quantum yield is sufficiently high, which is realized by several factors. Firstly, the physical separation of the absorption and emission minimizes Auger effect and other non-linear processes. Secondly, judiciously designing the structure/composition of the nanocrystals eliminates charge trap states within the emission zone and absorption zone. Thirdly, the protection zone (most outer shell) forces the photo-generated (or electro-injected in the case of electroluminescence) charges to efficiently fall into the emission zone.

The advantage in function comes from the structural advantages of the design, which include several aspects.
(1) Structurally, the emission zone is chosen as the core of a nanocrystal and the absorption zone is its inner shell. In this way, the emission center is located farthest from the surface of the nanocrystal to ensure efficient emission. The absorption zone is the inner shell, which has a large volume to offer an extremely high absorption coefficient at the excitation wavelength (volume increases as a cubic function of the radius). To maximize the absorption coefficient, the absorption zone is preferred to be a direct bandgap semiconductor.
(2) The bandgap of absorption zone is preferably larger than the emission zone, and the band offsets between two zones is preferred to be type-I. Type-I band offsets means that the conduction band (valence band) of one semiconductor is higher (lower) than that of the other semiconductor. However, in most cases, the absorption zone can reduce the quantum confinement of the exciton in the emission zone in a controllable fashion. As a result, the emission wavelength of the resulting nanocrystal is tunable.

In most cases, the lattice constants of the absorption zone and emission zone are different. To achieve a high emission efficiency, it is critical to adjust the lattice constants by varying the compositions. The lattice matching is centered at the absorption zone. For example, if ZnSe is chosen as the absorption zone and the emission wavelength targets 620 nm (red), the core material can be either InP—ZnSe alloy or CdSe—ZnSe alloy, which can reduce the lattice mismatch down to 2-3% readily. Alternatively, pure InP (or pure CdSe) can also be selected as the emission zone (the core). In this alternative choice, a thin (1-2 monolayers) and graded InP—ZnSe (or CdSe—ZnSe) alloy shell will be inserted between the core and the ZnSe shell.

To make the main absorption band efficiently separated from the emission peak, the thickness of the absorption zone (inner shell next to the core) usually should have a substantially greater volume than the emission zone (the core, or a part of the core). Though the exact thickness is determined by the volume extinction coefficients of the absorption zone and emission zone, two to twenty monolayers of the chosen material (a relatively wide bandgap semiconductor in comparison to the emission zone) would be typical for an emission zone with a size of about 2 nm. For typical II-VI and III-V semiconductors, this special example gives an absorption zone from approximately 5 to 500 times in volume of the emission zone.

From the discussion above, one can see that it would be very advantageous to use a small emission core. The emission peak position of the resulting nanocrystals, however, is tunable by allowing the excitons centered at the emission zone to partially delocalize into the absorption zone. In other words, one can tune the bandgap emission peak by designing the absorption layer as well.

The semiconductor nanocrystal can also include transition layers between the core and shell as well as the shell and protective shell layer. Usually, the transition layers between absorption zone and protection zone can also offer some absorption properties because such transition layers can have a composition close to the absorption layer. For example, if CdS is chosen as the absorption zone and ZnS is chosen as protection zone, one could use $Cd_xZn_{1-x}S$ as the transition layers. When x is greater 0.5, it could contribute some absorption to wavelengths above about 460 nm.

It should be pointed out that the emission zone, the absorption zone, or both do not need to be a pure semiconductor. To achieve a certain absorption band, one might use an alloyed absorption shell with a defined composition. Semiconductor science textbooks can teach one to tune the absorption band by alloying. It is desirable to engineer the lattice matching between these two critical zones.

As disclosed above, the absorption zone has a large volume in comparison to the emission zone. As a result, the absorption zone plays the biggest role in determining the lattice strain in the resulting nanocrystals. In addition, when the absorption band is chosen, such as the light from a 450 nm blue LED, the material choice of the absorption zone will be determined accordingly, and thus not suited for modifying its lattice constant. For these reasons, the current invention emphasizes lattice engineering with the absorption zone as the center of the design.

The composition of the emission zone (the core) can be tuned and transition layers can be placed between the absorption zone (inner shell) and the protection zone (outer shell). For example, if CdS is chosen as the absorption zone and a typical red emitter, such as 620 nm, is targeted, the emission zone could be a $CdSe_xS_{1-x}$ core nanocrystal. By decreasing x in this formula to about 0.5, one could reduce the lattice mismatching down to about 2-3%. For the same example, if ZnS is chosen as the protection zone, $Cd_xZn_{1-x}S$ could be used as the transition layer between the absorption zone and protection zone, in which x for each monolayer increases from the CdS zone to the ZnS zone. The lattice mismatch in between CdS and ZnS is about 8% and can be reduced to about 1% between CdS and $Cd_xZn_{1-x}S$ if x is around 0.9. In this way, the lattice mismatch will be taken care of very efficiently. The resulting nanocrystals showed a photoluminescence (PL) quantum yield in the range between 70-90%.

For the preferred LR dots specifically designed to have an emission-center core and at least one absorbing shell and at least one protection shell, core/shell/shell structures are both nanometer sized and highly monodisperse and may include, but are not limited to, those from II-VI and III-V semiconductors. As pointed above, these could include alloys of these semiconductors. The emission zone (core) should have the narrowest bandgap and the protection zone (outer shell) should have the widest bandgap. The bandgap of the absorption zone (inner shell) should be in the middle of those of the emission zone and protection zone. The absorption zone should have significantly large absorption cross-section in comparison to the emission zone and protection zone.

The nanocrystals are most preferably made by the methods described in U.S. Pat. Pub. No. 2007/0194279 and U.S. Pat application Ser. No. 10/763,068, incorporated herein by reference in their entirety.

The nanocrystals are prepared in a reaction utilizing solvent. The solvent can be a coordinating solvent or a non-coordinating solvent. The coordinating solvent can be selected from the group consisting of long-chain fatty amines, long-chain fatty acids, phosphine, phosphoric acids, and phosphine oxides. The solvent can be selected from the group consisting of octadecene (ODE), tributyl phosphine (TBP) and octadecylamine (ODA). The solvent can also be selected from the group consisting of dodecylamine (DA), hexadecylamine (HA), octadecylamine (OA), stearic acid (SA), lauric acid (LA), hexylphosphonic acid (HPA), tetradecylphosphonic acid (TDPA), and trioctylphosphine oxide (TOPO).

The non-coordinating solvent can be selected from water, hydrocarbon compounds, and other non-aqueous liquids. The non-coordinating solvent can also be selected from octadecene (ODE), ether, and ester.

The cation precursor solution may also include a ligand selected from a fatty acid, a fatty amine, a phosphine, a phosphine oxide, a phosphoric acid, a phosphinic acid, a sulphonic acid, or any combination thereof. The ligand may also be selected from a fatty acid, an fatty amine, a phosphine, a phosphine oxide, a phosphonic acid, a phosphinic acid, a sulphonic acid, or any combination thereof, any one of which having up to about 30 carbon atoms or any one of which having up to about 45 carbon atoms. The ligand can be selected from the group consisting of tributyl phosphine (TBP) and octadecylamine (ODA). The ligand can also be selected from the group consisting of dodecylamine (DA), hexadecylamine (HA), octadecylamine (OA), trioctylamine, oleyl amine, stearic acid (SA), lauric acid (LA), hexylphosphonic acid (HPA), tetradecylphosphonic acid (TDPA), and trioctylphosphine oxide (TOPO).

The ligands mentioned above can end up on the outer surface of the nanocrystals synthesized. When a mixture of ligands is used in a reaction system, the exact ligands to be found on the surface of the nanocrystals depend on the reaction conditions, coordination capability of the ligands, the mobility of the ligands on the surface of the nanocrystals, etc.

In addition, the present invention provides other types of colloidal materials including, but not limited to, quantum shells, quantum wells, 0D-2D nanocrystals, dual-emitting nanocrystals, and other complex structured nanocrystals, as described in U.S. patent application Ser. No. 10/763,068, incorporated herein by reference.

In simplest form, the doped semiconductor nanocrystals are used with an LED source.

LEDs are made by depositing layers of semiconductor material on a substrate wafer using an epitaxial method, such as metal-organic chemical vapor deposition or MOCVD. The various layers are doped to form p-type and n-type materials that result in the creation of an electric field at their interface (p-n junction). When a sufficient voltage is applied across a p-n junction, current flow is initiated and sustained by the recombination of holes and electrons. Upon recombination, energy approximately equal to the bandgap energy of the junction is released. For III-V semiconductor materials such as GaAs, InP, GaN etc., the released energy is in the form of light. Today, the InGaN—GaN system is employed for wavelengths from ~365 (ultra-violet, UV-A) to 550 (yellow-green) nm. For amber to red emission, the most efficient LEDs are based on the (Al,Ga)InP system.

For the purposes of the present invention, any LED source can be used in principle. However, for practical considerations, blue, violet or UV LEDs are most interesting, as they provide the best combination of preferred excitation wavelengths and highest radiant flux intensity. More preferred are LED sources that emit in the wavelength range of most preferably 405-480 nm, at 460 nm or lower, preferably 430 or lower or even 405-420 nm. Most preferred are LED sources that emit at 405 nm or lower (for example, 395 nm, 365 nm, 265 nm, etc.). We note here that there is a trade off between increasing absorption by the semiconductor nanocrystals and increased Stokes losses (due to larger down-conversion bands). Different applications will benefit from different combinations of LEDs and semiconductor nanocrystals. Useful references relating to LEDs can be found in Dupuis, R. D., and M. R. Krames. 2008. History, development, and applications of high-brightness visible light-emitting diodes. IEEE Journal of Lightwave Technology 26 (9): 1154-1171; Holonyak, N., Jr. 2000. Is the light emitting diode (LED) an ultimate lamp? American Journal of Physics 68: 864-866; Krames, M. R., O. B. Shchekin, R. Mueller-Mach, G. O. Mueller, L. Zhou, G. Harbers, and M. G. Craford. 2007. Status and future of high-power light-emitting diodes for solid-state lighting. IEEE Journal of Display Technology 3: 160-175; Manasevit, H. M., and W. I. Simpson. 1969. The use of metalorganics in the preparation of semiconductor materials: I. epitaxial gallium-v compounds. Journal of the Electrochemical Society 116 (12): 1725-1732; and Mueller-Mach, R., G. O. Mueller, M. R. Krames, and T. Trottier. 2002. High-power phosphor-converted light-emitting diodes based on III-nitrides. IEEE Journal of Selected Topics in Quantum Electronics 8: 339-345, all of which are incorporated herein by reference.

The doped semiconductor nanocrystals or semiconductor nanocrystals specifically designed to have an emission-center core and at least one absorbing alloy shell may be combined with the LED wafer or chip. The semiconductor nanocrystals may be coated on the wafer or dispersed in a matrix and applied to the wafer. This may occur at the point of manufacturing. The coating may also be applied as a separate, later step and by other than the manufacturer. The semiconductor nanocrystals may be used in the packaging for the wafer. The semiconductor nanocrystals may be applied in contact with, adjacent to or remote from the light source. The semiconductor nanocrystals may be used alone or dispersed in a matrix. The matrix may be a cured binder, a gel, a liquid, a fluid, a polymer or a gaseous matrix. The matrix may be a standard epoxy or silicone. Any optically transparent or translucent matrix may be used. However, the matrix need not be transparent or translucent with respect to the light from the light source, only the light produced by the doped semiconductor nanocrystals or semiconductor nanocrystals specifically designed to have an emission-center core and at least one absorbing alloy shell. The matrix may be a layer or contained within the packaging. The semiconductor nanocrystals are preferably homogeneously dispersed in the matrix. Preferably, the nanocrystals are dispersed in a matrix, preferably in a given concentration range of less than 40%, most preferably less than 20% and the matrix is a polymer matrix.

EXAMPLES

The following examples are provided to illustrate the invention.

The first set of examples describe methods to make d-dots, disperse d-dots into polymers and into optical fluids, make and test devices using these dispersions. The results show that substantially all of the emission from these devices is from the d-dots and not from the original excitation source, substantiating our claim that this approach can be used to eliminate binning. The second set of examples describe methods to make LR dots, disperse LR dots into a UV curable polymer, cast this dispersion into a film and measure its optical performance. Again the results show that substantially all of the emission from these devices is from the LR dots and not from the original excitation source.

Example 1: Synthesis of Cu Doped ZnSe Quantum Dots

Chemicals Used:

Zinc acetate, 1-Octadecene (ODE), Oleylamine (70%), Decanoic Acid (99+%), Tributylphosphine (TBP) were purchased from Aldrich, and Copper Chloride 99.999% (anhydrous), Manganese Chloride (99+%), Zinc Chloride (99+%), and Oleic Acid from Alpha Aesar. Se and S powder were also purchased from Aldrich. Manganese Stearate was purchased from City Chemical.

Preparation of Zinc Oleate:

Zinc Chloride ($ZnCl_2$), anhydrous—6.841 g
Oleic Acid—28.241 g
Tetramethyammonium Hydroxide (TMAH)—18.123 g
Molar Ratios: 2:2:1 Oleic Acid:TMAH:$ZnCl_2$, respectively.
Synthesis Procedure Used 1. Dissolve the $ZnCl_2$ in 200 mL of methanol in a 250 mL separatory funnel.
2. Dissolve the Oleic Acid and TMAH in 500 mL methanol in a 1 L 3-neck round bottom flask. Stir 30 minutes at room temperature.
3. Add the $ZnCl_2$ drop wise to the stirring solution of Oleic Acid and TMAH over a period of 1-2 hours.
4. Allow the reaction to stir for an additional 2-4 hours after the addition of $ZnCl_2$ is complete.

Purification Procedure:

1. Vacuum filter the reaction mixture using a Buchner funnel and filter paper; discard the filtrate.
2. The white solid product should be washed and re-filtered 6-8 times in a 500 mL Erlenmeyer flask with 100 mL of methanol each time to remove any excess TMAH.
3. Transfer the white solid product to a glass Petri dish. Dry the product in a vacuum drying oven at room temperature for at least 4 hours. Dry longer if possible.
4. Transfer to screw-capped vial for storage.

Preparation of Copper Oleate:

Copper (II) chloride hydrate, Puratronic®, 99.999% (metals basis)—1.345 g
Oleic Acid—5.65 g
Tetramethyammonium Hydroxide (TMAH)—3.63 g
Molar Ratios: 2:2:1 Oleic Acid:TMAH:Copper (II) Chloride, respectively.
Synthesis Procedure Used:

1. Dissolve the $CuCl_2$ in 100 mL of methanol in a 250 mL separatory funnel.
2. Dissolve the Decanoic Acid in 250 mL methanol in a 500 mL 3-neck round bottom flask, after it is dissolved add the TMAH. Stir 30 minutes at room temperature.
3. Add the $CuCl_2$ drop wise to the stirring solution of Oleic Acid and TMAH over a period of 1-2 hours.
4. Allow the reaction to stir for an additional 2-4 hours after the addition of $CuCl_2$ is complete.

Purification Procedure:

1. Vacuum filter the reaction mixture using a Buchner funnel and filter paper; discard the filtrate.

2. The white solid product should be washed and re-filtered 4-6 times in a 500 mL Erlenmeyer flask with 100 mL of methanol each time to remove any excess TMAH. Follow up with 1-2 washings with Acetone.

3. Transfer the white solid product to a glass Petri dish. Dry the product in a vacuum drying oven at room temperature for at least 4 hours. Dry longer if possible.

4. Transfer to screw-capped vial for storage.

Preparation of Pre-Cursor Solutions:

Zn Solution: To a 50 mL round-bottom vial, add (4 g Zinc Oleate+1.5 g Oleic Acid+14 g ODE)

Amine Solution: To a 20 mL (white capped) vial, add (6 g Oleylamine+4 g ODE)

Growth Solution: To a 20 mL (white capped) vial, add (2 g Oleylamine)

TBP-Se stock solution: TBP-Se stock solution was prepared inside a Glove-box under nitrogen with 1 mole Se in 1.6 moles of tributylphosphine (TBP). Roughly 1.9 g Se dissolved in 8 g TBP Cu stock solution: 25 mg of Copper Oleate and 4 g of Octadecene are added to a vial and slightly heated to fully dissolve the Copper Oleate then cooled for use.

Synthesis Procedure of Cu Doped Znse Quantum Dots:

1. In a clean vial add 25 mg of Copper Oleate and 4 mL of ODE.

2. Heat the mixture slightly until a clear solution is formed, then bubble argon through the solution to degas the mixture. Allow to cool before use.

3. Place a stir bar into a clean, dry 100 mL three-neck round bottom flask.

4. To the 100 mL 3-neck round bottom flask, add 0.4 g Zinc Decanoate+0.2 g Zinc Chloride+0.4 g Zinc Acetate+1.5 g Oleylamine+25 g ODE.

5. Place the flask in a fitted heating mantle. Attach a condenser, thermocouple sleeve, and septum. Turn on an Argon flow through the flask.

6. Bubble Argon through the solution while stirring.

7. At room temperature add a mixture of 2 mL of the Selenium solution+0.8 mL of the Copper Oleate solution.

8. Then, under Argon flow, heat the reaction up to 250° C. for 10-20 minutes (should have an emission position between 480-500 nm depending upon heating time).

9. If Blue emission is desired stop the reaction and purify, If Green emission is desired continue with the reaction at step 10.

10. Cool the reaction down to 200° C., remove the stopper under high Argon flow and add 0.4 g Zinc Acetate.

11. Replace the stopper and heat the reaction up to 250° C.

12. Heat at 250° C. for 10-15 minutes (emission should be just over 540 nm).

13. Cool the reaction down to room temperature for purification.

II. Purification

1. Once the original reaction solution has cooled down to at least 80° C., you can begin the purification process.

2. Transfer no more than 20 mL of the solution to a 50 mL centrifuge tube.

3. Add at least an equal amount of Acetone to the reaction solution in order to precipitate the nanocrystals turning the liquid cloudy.

4. Centrifuge the solution and discard the liquid portion.

5. Add either Hexanes or Toluene to dissolve the nanocrystals.

6. Add 5% TOP to the solution and store at room temperature in a dark place.

Example 2: Synthesis of Mn Doped ZnSe Quantum Dots

Synthesis Procedure of Mn Doped ZnSe Quantum Dots:

1. Place a stir bar into a clean, dry 250 mL three-neck round bottom flask.

2. To the 250 mL 3-neck round bottom flask, add 0.2 g Manganese Stearate and 50 g ODE.

3. Place the flask in a fitted heating mantle. Attach a condenser, thermocouple sleeve, and septum. Turn on an Argon flow through the flask.

4. Bubble Argon through the solution while stirring.

5. Heat the reaction solution up to 120° C. while bubbling Argon for at least 15 minutes.

6. The Zinc injection solution, growth solution, and amine solution are best effective when heated to 100° C. and purged with Argon before use. For the Zinc injection solution it will need to be heated to at least 100° C. before injection.

7. Heat the reaction solution up to 270° C., the reaction may be a slight brownish color but will be completely clear at 270° C. If the reaction does not become clear or is very dark/colored, stop the reaction and start again.

8. Once the reaction reaches 270° C., mix 2 mL of the Selenium solution with the Growth Solution and inject the entire mixture.

9. Cool the reaction to 250° C. for 15 minutes.

10. Heat the reaction solution up to 280° C.

11. Once the reaction reaches 280° C., inject 8 mL of the Zn Solution followed by 4 mL of the Amine Soln. (The Zn Solution must be clear before injection so be sure to thoroughly heat the solution).

12. Cool the reaction to 260° C.

13. After 10 minutes, inject 6 mL of the Zn Soln. (Be sure to follow the same protocol as discussed in step 14).

14. After 10 minutes inject the remainder of the Zn Solution into the reaction.

15. Cool down the reaction and purify.

II. Purification

1. Once the original reaction solution has cooled down to at least 80° C., you can begin the purification process.

2. Precipitate the reaction solution using a 1:1 ratio of Acetone. (Typically for a 250 mL Flask reaction four 50 mL centrifuge tubes are filled to 25 mL using the reaction mixture and then filled the rest of the way with Acetone to precipitate out the nanocrystals.)

3. Centrifuge the mixture until all the nanocrystals have settled out.

4. Remove the left over solution and add about 5 mL of Acetone and Ethyl Acetate to the precipitated nanocrystals. (Necessary to remove excess ODE and Oleic acid)

5. Shake and Centrifuge again.

6. Pour off the solution and dissolve the remaining nanocrystals in Toluene or the solution of your choice.

Example 3: Dispersion of Doped Quantum Dots in Polymer (Silicone)

A specific amount of solution (either Hexanes or Chloroform) containing a concentrated amounts of purified d-dots is added to an amount of Dow Corning 2-8630 silicone polymer fluid. Typically, 100 mg of d-dots are added to 5 grams of 2-8630 silicone fluid. The amounts will depend upon use, but maximum concentrations are 250 mg of d-dots in 1 gram of 2-8630 silicone fluid. The fluid mixture is then shaken/stirred vigorously until the nanomaterials are fully dissolved. The fluid is then put under vacuum for 12-24 hours to remove all excess solvent. The silicone fluid is then removed from the vacuum chamber and 250 μL of chloroform containing 150 μg of trimethylolpropane triacrylate (TMPTA) is added. 50 μL of chloroform and 30 μg of TMPTA are needed to cure 1 gram of 2-8630 silicone fluid. Chloroform is necessary to uniformly distribute the TMPTA curing agent throughout the 2-8630 silicone fluid. The mixture is then shaken/stirred vigorously in order to thoroughly mix the curing agent into the silicone fluid. The silicone fluid is then poured into a container/shape desired and allowed to sit at room temperature for 24 hours. After 24 hours, the silicone fluid will have cured into a solid substrate and is ready for use To use the d-dots in a solid matrix with the LEDs, the ligands on the d-dots were exchanged to best match the encapsulation material. For the silicone encapsulant, the ligands on the d-dots were exchanged to dodecanethiol and then the d-dots were dissolved in Chloroform. The d-dot solution was then added to the silicone and mixed thoroughly. The concentration of d-dots can range from 1-300 mg per gram of silicone. After mixing the chloroform was removed through vacuum filtration (rotovap or vacuum oven). Once the chloroform was removed the mixture could then be poured and cured. In a typical device the silicone/d-dot mixture would be added to a glass dome and a UV/near-UV LED would be pressed into the mixture. The silicone would then be cured forming a solid substrate with the LED in it. The exposed end would then be sealed using epoxy to reduce/remove any oxygen exposure.

Example 4: Dispersion of Doped Quantum Dots in Fluid (Optical Hydrocarbon)

The preparation of d-dots in liquid encapsulants is simpler than in solid ones. The ability to use liquid encapsulants enables multiple emissive colors of d-dots to be effectively and uniformly mixed, allowing excellent control of the color and color mixing of the light produced. For this work, the most effective liquid encapsulants were found to be hydrocarbon fluids. Their excellent thermal properties and compatibility with the d-dots made them excellent choices.

Purified d-dots in a solvent (Hexanes) are added to a thermally stable hydrocarbon solution. Typical Hydrocarbon solutions are: 1-Octadecene, Hexadecene, Mineral Oils, Spectrasyn 2-10 (Exxon), etc.

Cu Doped ZnSe:

In a 50 mL single-neck round bottom flask, add 200 mg of d-dots in solution to 15 grams of hydrocarbon fluid. Add 1 mL trioctylphosphine (TOP) to the mixture. Attach the flask to a rotovap and place the sample under vacuum and fast rotation to remove the excess solvent. Be sure to keep bath temperature between 40-60° C. Remove the flask from the rotovap after 1-2 hours. Remove the fluid from the flask and place in a capped vial for storage and later use.

Mn Doped ZnSe:

In a 50 mL single-neck round bottom flask, add 200 mg of d-dots in solution to 15 grams of hydrocarbon fluid. Attach the flask to a rotovap and place the sample under vacuum and fast rotation to remove the excess solvent. Be sure to keep bath temperature between 40-60° C. Remove the flask from the rotovap after 1-2 hours. Remove the fluid from the flask and place in a capped vial for storage and later use.

Fabrication of Devices Using Doped Quantum Dots

D-dots are capable of being encapsulated in liquid silicone that can then be cured to form solid substrates. These substrates can be formed into specific patterns and shapes in order to absorb light from an excitation source, such as an LED, and convert it to specific wavelengths of light.

Example 5: Fabrication of Devices Using Doped Quantum Dots—Dome Solid

A 1 W 405 nm near-UV LED is prepared by attaching 2" copper leads to the LED. For a typical device, a small glass dome (~5 mL) is used to hold the d-dots encapsulation. 50 mg of d-dots is added to 2 grams of 2-8630 Fluid. The mixture is handled according to the procedure described above and poured into the glass dome for curing. After the mixture has been poured into the glass dome the 405 nm LED is pressed into the fluid mixture and held in place until the fluid has fully cured. Typical curing takes 24 hours at room temperature. After the silicon/d-dots mixture has fully cured, the remainder of the glass dome is filled with epoxy. The epoxy is necessary to act as an oxygen barrier and to hold/stabilize the LED.

The LED can then be operated by applying current (300 mA and below) generating 405 nm light that is absorbed and emitted by the d-dots in the cured silicone Example 6: Fabrication of Devices Using Doped Quantum Dots—Lens Solid For a typical device a small lens (1-2 cm diameter) is used to hold the d-dots encapsulation. 50 mg of d-dots is added to 1 gram of 2-8630 fluid. The mixture is handled according to the procedure described above and poured into the lens for curing. The sample is allowed to sit for 24 hours to enable the silicone fluid to fully cure. The sample is then placed over an LED chip and sealed in place with epoxy around the edges of the lens. The LED can then be operated where the light from the LED is absorbed and re-emitted by the d-dots in the cured silicone.

Example 7: Fabrication of Devices Using Doped Quantum Dots—Dome Fluid (Single Color Emission)

A 1 W 405 nm near-UV LED is prepared by attaching 2" copper leads to the LED and a 2" long brass rod for a heat sink. The LED is then placed through the inner hole of a 2.5 cm (diameter) washer and immobilized using epoxy. The LED will need to be held in place until the epoxy fully cures (2-3 hours). Once the LED is securely cured to the washer it is ready to be attached to the glass dome. For a typical device a small glass dome (~5 mL) is used to hold the d-dots encapsulation.

A d-dot sample in the hydrocarbon fluid is prepared as described above in a stock solution. Enough of the stock solution is added to 5 mL of pure hydrocarbon fluid to enable to optical density of the solution to be 1 at 405 nm. 5 mL is then added to the glass dome, enough to fully fill the dome with the d-dot hydrocarbon fluid. Epoxy is placed along the lip of the dome and the LED/washer is pressed over the lip and held in place until the epoxy fully cures. Further epoxy can be placed around the edge of the rim to ensure a complete seal. After the LED/washer is securely cured to the glass dome the device is ready to be used/tested.

Example 8: Fabrication of Devices Using Doped Quantum Dots—Dome Fluid (Multiple Color Emission)

A 1 W 405 nm near-UV LED is prepared by attaching 2" copper leads to the LED and a 2" long brass rod for a heat sink. The LED is then placed through the inner hole of a 2.5 cm (diameter) washer and immobilized using epoxy. The LED will need to be held in place until the epoxy fully cures (2-3 hours). Once the LED is securely cured to the washer it is ready to be attached to the glass dome. For a typical device a small glass dome (~5 mL) is used to hold the d-dots encapsulation.

Multiple d-dot samples in the hydrocarbon fluid are prepared as described above in a stock solution. D-dots with emission colors of blue, green, yellow, and orange were used for these devices. Enough of the stock solution is added to 5 mL of pure hydrocarbon fluid to enable to optical density of the mixture to be 1 at 405 nm. The concentration of the colors of the d-dots directly depended upon the desired color temperature (CCT) of the light emitted. 5 mL is then added to the glass dome, enough to fully fill the dome with the d-dot hydrocarbon fluid. Epoxy is placed along the lip of the dome and the LED/washer is pressed over the lip and held in place until the epoxy fully cures. Further epoxy can be placed around the edge of the rim to ensure a complete seal. After the LED/washer is securely cured to the glass dome, the device is ready to be used/tested

Example 9: Remote Doped Quantum Dots

Another method for incorporating the d-dots with an LED is to cure the d-dots in a dome or lense and place that over an LED. Here, a solid state lighting (SSL) device was fabricated with a narrow space between an LED and silicone/d-dots (doped semiconductor nanocrystal) blend. Light was produced purely from the d-dot coating.

Example 10: Liquid Encapsulants for Doped Quantum Dots

The method for producing LED lighting devices based on d-dots in liquid encapsulants can be accomplished through many methods, here we describe one of such methods. A typical LED excitation source for the d-dots will have an emission wavelength in the UV or near-UV range, 405 nm LEDs fit this criterium well. A 405 nm LED is then fitted with a rod-like heat sink and the leads are attached. The LED/heat sink/leads are then attached to a flat metal surface with a hole in the center, typically a washer. The LED is then sealed to the washer and any gaps are plugged by filling with epoxy. A glass dome is then completely filled with a hydrocarbon fluid containing one or more colors of d-dots. A typical concentration for the d-dots ranged from 5-300 mg per mL of fluid. Once the dome is filled then the washer/LED is lowered onto the dome and epoxy is used to seal the dome and washer together. The device is then immobilized for 24 hours in order to allow the epoxy to fully cure.

Measurement of Devices Using Doped Quantum Dots

The device was tested by using an integration sphere (Labsphere) which was connected to an Ocean Optics USB 2000 Spectrometer by an optical fiber. A Keithly 2400 source meter was the LED power source and the current for the test was adjusted between 30 mA and 350 mA. The system was calibrated using Ocean Optics LS-1-Cal-Int calibration lamp. The correlated color temperature (CCT) color rendering index (CRI), luminous efficiency and optical spectroscopy of the SSL device was measured and compared to a conventional white LED as a function of injection current.

For these specific SSL devices, it was found that when using a 405 nm LED at 300 mA the power efficiency of the d-dot emission was ~20%. If the current was lowered to 50 mA the power efficiency would increase to over 25%.

Using the method described above, it was possible to make individual color LEDs using the four primary color d-dots available. All devices were capable of absorbing all 405 nm light when driven at 300 mA with colors ranging from 485 nm (Blue), 540 nm (Green), 583 nm (Yellow), and 610 nm (Orange). A blue lighting device with a wavelength of 484 nm, a CRI of 26, a CCT of >90000K and luminous flux of 15 lm was produced. A green lighting device with a wavelength of 515 nm, a CRI of 35, a CCT of 6775 K, and a luminous flux of 6.7 lm was produced. A yellow lighting device and an orange lighting device with wavelength of 610 nm were also fabricated. The orange device is illustrated in FIG. 6. A purple LED (400 nm) was used as the light source. The graph in FIG. 6 clearly shows the absence of any light from the LED, indicating that the d-dots absorbed essentially all of the light emitted from the light source and converted it to orange light at 610 nm.

It was also possible to effectively mix the four color emitting d-dots together to create uniform white light of almost any color temperature. The example shown demonstrates two of the possibilities that were created by mixing the blue, green, yellow, and orange emitting d-dots. The devices had CCTs of 5000 K and 3000 K with CRIs near 80. The concentration of the specific colors necessary for creating any color temperature are easily managed and can be controlled to maintain the emission on the CIE black body spectral curve at any color temperature.

Using d-dots in their, liquid encapsulants is not limited to use in single LED systems. When using a liquid encapsulant, it is advantageous to use multiple LED systems such as those used in existing LED devices and luminaires. In the example shown below, 405 nm LEDs are ringed around a pool of fluid containing specific mixtures of d-dots. The concentrations of the d-dots can be adjusted to obtain the desired color temperature and color rendering. Using d-dots in such a device will maximize their output and enable them to be effectively used in a lighting device.

Example 11: SSL Project Progress with Lighting Device Optical Spectrum Using Doped Quantum Dots White lighting devices were fabricated utilizing d-dots with various color temperatures in liquid. A first lighting device was prepared, which had a CRI of 56.3, CCT of 2000 K, luminous flux of 2.3 μm and an efficiency of 25.5 lm/W. The spectrum of the optical device had two strong peaks, one at 602 nm and a second at 420 nm. A second, cooler, lighting device was made, having a CRI of 67.7, a CCT of 3200 K, a luminous flux of 1.6 μm and a luminous efficiency of 18 lm/W. It had an optical spectrum with three main peaks at 420 nm, 530 nm, and 600 nm.

Example 12: Non-Contact SSL Device

A non-contact SSL device was fabricated. Color measurements were done. The CCT and CRI were found to be similar to those of LED. Light transmission from silicone film was also measured and no absorption or scattering in the visible range was detected. This Example is illustrated in FIG. 4. The non-contact SSL device had air space (spacer) located between the LED and the semiconductor nanocrystals.

Example 13: SSL with New Design

A second device, illustrated in FIG. 5, was fabricated, using 100 mg of orange d-dots in 1.5 gm of silicone in an Ar atmosphere. The original LED had a CRI of 75 and a CCT of 6700 K. The final device, combining the d-dot layer, Ar spacer and LED had a CRI of 73 and a CCT of 5400 K. The combination device produced a warmer light.

Example 14: Synthesis of LR Quantum Dots with CdSe Core

Materials:
Technical grade (90%) Octadecene (ODE), Indium acetate (In(Ac)$_3$, 99.99%), Tri-n-octylphosphine (TOP, 97%), Stearic acid (SA, 98%), oleic acid (90%), Zinc stearate (ZnO 12.5-14%), Tris-trimethylsily phosphine (P(TMS)$_3$, 95%) 1-octylamine (99%) were purchased from Alfa. Oleylamine (97%) and octadecylamine (ODA, 97%) were purchased from Adrich. Copper stearate was prepared in our lab. All the chemicals were used without further purification.
Precursor Solutions
0.1M Cd Solution:
Place 1.28 g CdO+22.5 g OA (oleic acid)+65.0 g ODE (1-Octadecene) in a 250 ml round bottom flask. Heat to 250° C. under argon flow until clear. Allow the solution to cool to room temperature and store the reaction mixture at room temperature. When needed, this mixture is re-heated to become clear as the Cd solution to be used below.
0.1M Zn Solution:
Place 1.215 g ZnO+33.9 g OA (oleic acid) (30 ml)+94.6 g ODE (1-Octadecene) in a 250 mL round bottom flask. Heat to 240° C. under argon flow until clear. store the reaction mixture at room temperature. When needed, this mixture is re-heated to become clear as the Cd solution to be used below.
0.1M S Solution:
Place 0.48 g S+118.5 g ODE (1-Octadecene) in a 250 mL round bottom flask. Cap the solution and heat it until all the S powder is completely dissolved. Once the Sulfur has dissolved in the ODE the reaction should be stable at room temperature. In some circumstances some of the Sulfur has precipitated out of the solution. If this happens, re-heat the solution until all the Sulfur is dissolved.
CdSe Emission Core Preparation
For a typical reaction, the mixture of 0.2 mmol of CdO, 0.8 mmol of stearic acid and 2 g of ODE in a 25 ml three neck flask is heated to about 200° C. to obtain colorless clear solution. After this solution is cooled down to room temperature, ODA (1.5 g) and 0.5 g TOPO are added into the flask. Under argon flow, this system is re-heated to 280° C. At this temperature, a selenium solution made by dissolving 2 mmol of Se in 0.472 g of TBP and further diluted with 1.37 g of ODE is quickly injected. The growth temperature is then reduced to 250° C. Typically this reaction generates CdSe nanocrystals of about 3.5 nm in size with the first absorption peak around 570 nm. The reaction mixture is allowed to cool down to room temperature, and a standard extraction procedure using hexanes/ODE-methanol two phase system is used to purify the nanocrystals from side products and unreacted precursors. The nanocrystals remain in the hexanes/ODE layer, and the unreacted precursors and excess amines are extracted into the methanol layer. The particle concentration of the purified CdSe solution in hexanes, as stock solution for core/shell growth, is measured using Beer's law. This solution will be used for the growth of the LR-dots.
Absorbing Shell Preparation
For a typical reaction,
1. To a 250 mL 3-neck round bottom flask, add 15 g ODA (octadecylamine)+15 g ODE (octadecene)+2 g TOPO (tri-octylphosphine oxide). Attach the reaction flask to a condenser.
2. Add a known amount of CdSe nanocrystals with its concentration determined above to the reaction flask. The hexanes for dissolving the CdSe nanocrystals is boiled off with Ar flow. The growth of core/shell nanocrystals using the SILAR method is based on alternating injections of the Cd solution, Zn solution and S solution made using the procedures disclosed above into the solution containing the CdSe-core nanocrystals. The amount of the injection solution for each monolayer can be deduced from a calculation of the number of surface atoms using standard formula.
3. Add the first injection to the reaction while at room temperature. This is usually the first and second CdS layers, injected together.
4. Seal the reaction vessel and begin the flow of the inert gas. (It is necessary to keep sufficient positive internal pressure to eliminate any possible oxygen exposure from leaks. Furthermore it is necessary to overcome any flash boiling of low boiling temperature liquids formed during the reaction.)
5. Heat the reaction to 235° C. for at least 30 minutes.
6. Start the next layer by cooling the reaction down to 150° C. by adding the designated amount and type of injection solutions, usually the cationic solution(s) is added first and followed by the S solution. The composition of this monolayer of shell and the next few ones can be pure CdS for high absorbance in the purple-blue window (>460 nm) and low absorbance in the green-yellow-orange-red window (approximately above 500 nm). For example, the absorbance ratio between 450 nm and 550 nm can be used for characterization of the re-absorption properties of the resulting LR-dot nanocrystals with a PL peak greater than 570 nm. Alternatively, this monolayer can be a mixed Cd$_x$Zn$_{1-x}$S shell by controlling the Zinc solution and Cd solution ratio.
7. After all the precursors have been added, heat the reaction to a temperature in the range between 230° C. and 260° C. for the growth of the next layer. Usually, the more Zn solution (in comparison to Cd solution) is, the higher the reaction temperature should be.
8. Repeat steps 6-7 for each layer.
9. To form the exterior protective layer, cool the reaction down to 150° C. by adding the designated amount and type of injection solutions, usually the cationic Zn solution(s) is added first and followed by the S solution. Inject the precursors for the exterior protective layer. After all the precursors have been added, heat the reaction to a temperature in the range between 230° C. and 260° C. for the growth of the next layer.
10. The progress of the reaction can be monitored through periodic measurements of the absorption (UV-Vis) and emission (Fluorometer) of the reaction.
11. The amount of precursors to inject for each layer is determined using a standard method based on the size, concentration, crystal lattice of the nanocrystal system.
12. After the last injection the reaction is cooled down to purify using a standard hexanes/ODE-methanol extraction method. If solid form of nanocrystals are needed, precipitation of the nanocrystals can be achieved by adding acetone, ethyl acetate, or other polar solvent into the nanocrystals dissolved in the hexanes/ODE solution.

Example 15: Synthesis of LR Quantum Dots with $CdSe_xS_{1-x}$ Alloy Core

Materials:

Technical grade (90%) Octadecene (ODE), Indium acetate (In(Ac)$_3$, 99.99%), Tri-n-octylphosphine (TOP, 97%), Stearic acid (SA, 98%), oleic acid (90%), Zinc stearate (ZnO 12.5-14%), Tris-trimethylsily phosphine (P(TMS)$_3$, 95%) 1-octylamine (99%) were purchased from Alfa. Oleylamine (97%) and octadecylamine (ODA, 97%) were purchased from Adrich. Copper stearate was prepared in our lab. All the chemicals were used without further purification.

Precursor Solutions 0.1M Cd Solution:

Place 1.28 g CdO+22.5 g OA (oleic acid)+65.0 g ODE (1-Octadecene) in a 250 ml round bottom flask. Heat to 250° C. under argon flow until clear. Allow the solution to cool to room temperature and store the reaction mixture at room temperature. When needed, this mixture is re-heated to become clear as the Cd solution to be used below.

0.1M Zn Solution:

Place 1.215 g ZnO+33.9 g OA (oleic acid) (30 ml)+94.6 g ODE (1-Octadecene) in a 250 mL round bottom flask. Heat to 240° C. under argon flow until clear. store the reaction mixture at room temperature. When needed, this mixture is re-heated to become clear as the Cd solution to be used below. 0.1M S solution:

Place 0.48 g S+118.5 g ODE (1-Octadecene) in a 250 mL round bottom flask. Cap the solution and heat it until all the S powder is completely dissolved. Once the Sulfur has dissolved in the ODE the reaction should be stable at room temperature. In some circumstances some of the Sulfur has precipitated out of the solution. If this happens, re-heat the solution until all the Sulfur is dissolved.

$CdSe_xS_{1-x}$ Emission Core Preparation

Separately, a selenium solution is made by dissolving 2 mmol of Se in 0.472 g of TBP and further diluted with 1.37 g of ODE in the glove box, and a sulfur solution is made according to the procedure described above. For synthesis of $CdSe_xS_{1-x}$ alloy core nanocrystals with given Se:S ratio, the Se solution and S solution are mixed with a desired proportion to obtain a mixed anionic injection solution.

For a typical reaction, the mixture of 0.2 mmol of CdO, 0.8 mmol of stearic acid and 2 g of ODE in a 25 ml three neck flask is heated to about 200° C. to obtain colorless clear solution. After this solution is cooled down to room temperature, ODA (1.5 g) and 0.5 g TOPO are added into the flask. Under argon flow, this system is re-heated to 280° C. At 280° C., the mixed anioic injection solution with a certain volume is then injected into the reaction solution. The reaction mixture is reduced to 250° C. and maintains at this temperature for 2 to 20 minutes dependent on the size of the nanocrystals needed. The reaction mixture is allowed to cool down to room temperature, and a standard extraction procedure using hexanes/ODE-methanol two phase system is used to purify the nanocrystals from side products and unreacted precursors. The nanocrystals remain in the hexanes/ODE layer, and the unreacted precursors and excess amines are extracted into the methanol layer. The particle concentration of the purified CdSe solution in hexanes, as stock solution for core/shell growth, is measured using Beer's law. This solution will be used for the growth of the LR-dots.

Absorbing Shell Preparation

For a typical reaction,

1. To a 250 mL 3-neck round bottom flask, add 15 g ODA (octadecylamine)+15 g ODE (octadecene)+2 g TOPO (tri-octylphosphine oxide). Attach the reaction flask to a condenser.

2. Add a known amount of CdSe nanocrystals with its concentration determined above to the reaction flask. The hexanes for dissolving the CdSe nanocrystals is boiled off with Ar flow. The growth of core/shell nanocrystals using the SILAR method is based on alternating injections of the Cd solution, Zn solution and S solution made using the procedures disclosed above into the solution containing the CdSe-core nanocrystals. The amount of the injection solution for each monolayer can be deduced from a calculation of the number of surface atoms using standard formula.

3. Add the first injection to the reaction while at room temperature. This is usually the first and second CdS layers, injected together.

4. Seal the reaction vessel and begin the flow of the inert gas. (It is necessary to keep sufficient positive internal pressure to eliminate any possible oxygen exposure from leaks. Furthermore it is necessary to overcome any flash boiling of low boiling temperature liquids formed during the reaction.)

5. Heat the reaction to 235° C. for at least 30 minutes.

6. Start the next layer by cooling the reaction down to 150° C. by adding the designated amount and type of injection solutions, usually the cationic solution(s) is added first and followed by the S solution. The composition of this monolayer of shell and the next few ones can be pure CdS for high absorbance in the purple-blue window (>460 nm) and low absorbance in the green-yellow-orange-red window (approximately above 500 nm). For example, the absorbance ratio between 450 nm and 550 nm can be used for characterization of the re-absorption properties of the resulting LR-dots nanocrystals with an PL peak greater than 570 nm. Alternatively, this monolayer can be a mixed $Cd_xZn_{1-x}S$ shell by controlling the Zinc solution and Cd solution ratio.

7. After all the precursors have been added, heat the reaction to a temperature in the range between 230° C. and 260° C. for the growth of the next layer. Usually, the more Zn solution (in comparison to Cd solution) is, the higher the reaction temperature should be.

8. Repeat steps 6-7 for each layer.

9. Add the exterior protection layer.

10. The progress of the reaction can be monitored through periodic measurements of the absorption (UV-Vis) and emission (Fluorometer) of the reaction.

11. The amount of precursors to inject for each layer is determined using a standard method based on the size, concentration, crystal lattice of the nanocrystal system.

12. After the last injection the reaction is cooled down to purify using a standard hexanes/ODE-methanol extraction method. If solid form of nanocrystals are needed, precipitation of the nanocrystals can be achieved by adding acetone, ethyl acetate, or other polar solvent into the nanocrystals dissolved in the hexanes/ODE solution.

Characterization of the Nanocrystals of Examples 14 and 15:

Transmission Electron Microscopy (TEM) and High resolution TEM (HR-TEM): The low-resolution TEM images are taken on a JEOL 100CX transmission electron microscope with an acceleration voltage of 100 kV. Carbon-coated copper grids are dipped in the hexanes or toluene solutions to deposit nanocrystals onto the film. High-resolution TEM (HRTEM) pictures are taken using a Taitan microscope with an acceleration voltage of 300 kV.

The other measurements: X-ray powder diffraction (XRD) patterns are obtained using a Philips PW1830 X-ray diffractometer. Energy-Dispersive Spectroscopy (EDS) is used for elemental analysis using a Philips ESEM XL30 scanning electron microscope equipped with a field emission gun and operated at 10 kV. UV-vis spectra are recorded on an HP8453 UV-visible spectrophotometer. Photoluminescence (PL) spectra are taken using a Spex Fluorolog-3 fluorometer. The PL quantum yields of the nanocrystals are measured using a standard integration sphere protocol (Ocean Optics).

Example 16: Preparation of LR Quantum Dots Containing Optics for Lighting Applications Quantum dots synthesized using the method as described in Example 14 or 15 were surface modified via ligand exchange and were then dispersed in an UV-curable liquid, followed by UV curing.

Method of Ligand Exchange and Dispersion in UV-Curable Polymer:

1. Take 2 ml quantum dots (10 mg/ml nanocrystal concentration in toluene) solution in 15 ml small centrifuge tube. PL position and full-width-at-half-max (FWHM) are measured by Hitachi 7000 spectrophotometer. Quantum efficiency is measured using an Ocean Optics integrating sphere and USB 2000+ spectrometer.

TABLE 3

Properties of quantum dots before ligand exchange and dispersion in UV-curable polymer

| Batch# | Concentration (mg/ml) | PL position | QE | FWHM |
|---|---|---|---|---|
| 1 | 10 | 609 | 81% | 35 |
| 2 | 10 | 609 | 81% | 36 |
| 3 | 10 | 608 | 77% | 37 |
| 4 | 10 | 610 | 45% | 40 |

2. Add 100 mL of methyl mercapto propionate ligand.

3. Shake and sonicate the above solution for 20 minutes in a bath sonicator.

4. Continue mixing on a shaker overnight.

5. Add 10 ml Ethyl Acetate to precipitate LR dots.

6. Centrifugation at 3000 rpm for 4 minutes; decant supernatant and dry the remaining solids for 5 minutes.

7. Add 3 ml acetone (acetone only, no other solvent) and shake the centrifuge tube vigorously to wash extra ligands.

8. Centrifugation at 3000 rpm for 2 minutes; decant supernatant and dry the remaining solids for 5 minutes.

9. Add 15 ml chloroform and 7 ml toluene and re-disperse the solids.

10. Add 6 ml UV-curable polymer and shake the dispersion overnight.

11. Remove all solvent using a Rotavap.

TABLE 4

Properties of quantum dots after ligand exchange and dispersion in UV-curable polymer. PL position and full-width-at-half-max (FWHM) are measured by Hitachi 7000 spectrophotometer. Quantum efficiency is measured using an Ocean Optics integrating sphere and USB 2000+ spectrometer.

| Batch# | Concentration (wt %) | UV-curable polymer | PL position | QY | FWHM |
|---|---|---|---|---|---|
| 1 | 2 | NOA63 | 609 | 77% | 38 |
| 2 | 2 | NOA63 | 609 | 76% | 39 |
| 3 | 2 | NOA63 | 608 | 76% | 37 |
| 4 | 1.5 | NOA61 | 610 | 45% | 41 |

Example 17: Preparation of LR Quantum Dot Film on a Glass Substrate

1. Remove all residual organic solvent in the dispersion under vacuum for 1 hour.

2. Dispense 47 mg Batch 4 on a glass disk substrate, forming a 10 mm diameter film. The quantum dots concentration is around 1.5 wt %.

TABLE 5

| Sample ID | Film thickness | Film diameter |
|---|---|---|
| 4-200 | 200 micrometer | 10 mm |
| micrometer | | |
| 4-300 | 300 micrometer | 10 mm |
| micrometer | | |

3. Cure the film under 365 nm UV for 3 minutes.

Example 18: Preparation of LR Quantum Dot Film Between Two Glass Substrates

1. Remove all residual organic solvent in the dispersion under vacuum for 30 minutes.

2. Dispense the dispersion on a glass substrate (details shown in the table below).

TABLE 6

| Sample ID | Dispense amount (g) | Glass disc diameter | Glass disc thickness | Film thickness |
|---|---|---|---|---|
| 1 | 0.51 | 56 mm | 0.4 mm | 160 micrometer |
| 2 | 0.47 | 56 mm | 0.4 mm | 150 micrometer |
| 3 | 0.44 | 56 mm | 0.4 mm | 140 micrometer |

3. Center the dispensed liquid on the glass substrate as much as possible.

4. Apply the top disc (56 mm in diameter and 0.4 mm in thickness) very gently and allow the dispersion to spread and wet all glass disc surface.

5. UV curing: Cure the LR dots for 3-minutes using a 365 nm 36 W UV lamp.

Example 19: LR Quantum Dot Film

A quantum dot film which has been fully cured in UV-curable polymer (see detailed properties and their preparation method in Examples 14 and 15) is placed in front of a LED source (single excitation wavelength @ 405 nm, 3.2V, 100 mA). The film thickness is 300 micrometer, the absorbance at 405 nm is around 1.2, which means around 94% incoming 405 nm photons will be absorbed by quantum dots. An anti-reflection film (3M CM592) is coated on the quantum dot film (facing LED source) so that all emitted photons can be collected by the integrating sphere behind the quantum dots film.

The LR dot film sample was mounted on the port of an integrating sphere such that all the excitation from the source went through the film into the integrating sphere and was then collected.

Terminology:
Power conversion efficiency (%)=$P_{ph}/P_L$;
405 nm punch through (%)=$P_{Lpth} P_L$,
$P_L$ is 405 nm excitation power; $P_{ph}$ is power of phosphor emission; $P_{Lpth}$ is power of punch through
QE: quantum efficiency, as measured using an Ocean Optics integrating sphere and USB 2000+ spectrometer.

Data Collected Using Ocean Optics USB 2000+ Spectrometer

TABLE 7

|  | Power (350-470 nm) | Power (550-700 nm) |
|---|---|---|
| No film | 4318 uW | 21 uW |
| Batch 4-200 μm | 173 uW | 537 uW |
| No film | 5507 uW | 28 uW |
| Batch 4-300 μm | 371 uW | 780 uW |

TABLE 8

| Sample ID | Punch Thru | QE | Power Conv. Eff. |
|---|---|---|---|
| Batch 4-200 μm | 6.3% | 45% | 16% |
| Batch 4-300 μm | 4% | 45% | 13% |

Note:
6.3% punch thru means that 93.7% source photons are absorbed by the quantum dots film while a 4% punch through means that 96% of the source photons are absorbed by the film. These examples clearly show how an LR dot film can be used to absorb substantially all of the excitation from the source LEDs and control fully the emission output from the device.

The invention claimed is:

1. A light converting composition comprising luminescent semiconductor nanocrystals capable of receiving substantially all of the fixed wavelength range of light of a light source and converting said fixed wavelength range of light to at least one different wavelength range of light, wherein said luminescent semiconductor nanocrystals comprise undoped, direct bandgap, luminescent low reabsorption (LR) semiconductor nanocrystals, having, simultaneously, an emission center core surrounded by at least one absorbing shell, wherein the emission and absorption of said low reabsorption (LR) semiconductor nanocrystals is physically separated to provide well separated absorption and emission spectral bands reducing self-quenching of the emission of the low reabsorption (LR) semiconductor nanocrystals to zero, wherein said at least one absorbing shell has 5 to 500 times the volume of said emission center core, and wherein said absorbing shell comprises two to twenty monolayers.

2. The light converting composition of claim 1 wherein substantially all is said semiconductor nanocrystals capable of receiving 90% or greater of the fixed wavelength range of light of a light source and converting said fixed wavelength range of light to at least one different wavelength range of light.

3. The light converting composition of claim 1 wherein said semiconductor nanocrystal comprises at least one of the group consisting of ZnSe, CdSe and InP.

4. The light converting composition of claim 1 wherein said semiconductor nanocrystals comprise a mixture of different semiconductor nanocrystals.

5. The light converting composition of claim 4 wherein said different semiconductor nanocrystals absorb in the same range, but emit in different ranges.

6. The light converting composition of claim 1 wherein said semiconductor nanocrystals comprise, simultaneously, an emission center surrounded by at least one absorbing shell and a protective exterior shell.

7. The light converting composition of claim 1 wherein said fixed wavelength range of light is less than 460 nm.

8. The light converting composition of claim 1 wherein said at least one different wavelength range of light is at least one member selected from the group consisting of red, blue, yellow, orange, green and combinations thereof.

9. The light converting composition of claim 1, wherein said semiconductor nanocrystals are dispersed in a matrix.

10. The light converting composition of claim 1, wherein said semiconductor nanocrystals are dispersed in a solid or fluid encapsulant.

11. The light converting composition of claim 1 further comprising ligand located on the outer surface of the semiconductor nanocrystals.

12. An LED source comprising an LED wafer and at least one layer of a light converting composition comprising luminescent semiconductor nanocrystals capable of receiving substantially all of the light of the LED wafer and converting said light of the LED wafer to at least one different wavelength range of light, wherein said undoped, direct bandgap, luminescent semiconductor nanocrystals comprise low reabsorption (LR) semiconductor nanocrystals, having, simultaneously, an emission center core surrounded by at least one absorbing shell, wherein the emission and absorption of said low reabsorption (LR) semiconductor nanocrystals is physically separated to provide well separated absorption and emission spectral bands reducing self-quenching of the emission of the low reabsorption (LR) semiconductor nanocrystals to zero, wherein said at least one absorbing shell has 5 to 500 times the volume of said emission center core, and wherein said absorbing shell comprises two to twenty monolayers.

13. A device comprising an LED light source in combination with a light converting composition comprising semiconductor nanocrystals capable of receiving substantially all of the light of said LED light source and converting it to at least one different wavelength range of light, wherein said semiconductor nanocrystals comprise undoped, direct bandgap, low reabsorption (LR) semiconductor nanocrystals, having, simultaneously, an emission center core surrounded by at least one absorbing shell, wherein the emission and absorption of said low reabsorption (LR) semiconductor nanocrystals is physically separated to provide well separated absorption and emission bands reducing self-quenching of the emission of the low reabsorption (LR) semiconductor nanocrystals to zero, wherein said at least one absorbing shell has 5 to 500 times the volume of said emission center core, and wherein said absorbing shell comprises two to twenty monolayers.

14. The device of claim 13 wherein said light converting composition is adjacent to the LED light source.

15. The device of claim 13 wherein said light converting composition is in contact with the LED light source.

16. The device of claim 13 wherein said light converting composition is remote from the light source.

17. The device of claim 13 wherein substantially all of the emission of said device is emitted from said semiconductor nanocrystals.

* * * * *